United States Patent
Goyal et al.

(10) Patent No.: US 8,685,549 B2
(45) Date of Patent: Apr. 1, 2014

(54) NANOCOMPOSITES FOR ULTRA HIGH DENSITY INFORMATION STORAGE, DEVICES INCLUDING THE SAME, AND METHODS OF MAKING THE SAME

(75) Inventors: Amit Goyal, Knoxville, TN (US); Junsoo Shin, Brentwood, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 535 days.

(21) Appl. No.: 12/956,598

(22) Filed: Nov. 30, 2010

(65) Prior Publication Data

US 2012/0033331 A1 Feb. 9, 2012

Related U.S. Application Data

(63) Continuation-in-part of application No. 12/850,521, filed on Aug. 4, 2010, and a continuation-in-part of application No. 12/850,398, filed on Aug. 4, 2010.

(60) Provisional application No. 61/387,743, filed on Sep. 29, 2010.

(51) Int. Cl.
  *C30B 23/02* (2006.01)
  *B32B 9/00* (2006.01)
  *G11B 5/127* (2006.01)
  *G11B 5/706* (2006.01)

(52) U.S. Cl.
  USPC ........ 428/846.2; 428/323; 428/368; 428/389; 252/500; 252/62.51 R; 117/88; 117/95; 427/548; 427/123; 427/126.2; 427/585; 427/595; 360/110

(58) Field of Classification Search
  USPC ................. 505/170, 831, 171, 818, 819, 931; 428/846.2, 698, 702, 354, 832.1, 842, 428/323, 357, 364, 368, 389; 360/110; 427/123, 126.1, 126.3, 126.6, 250, 427/595, 548, 585, 597; 117/9, 84–89, 94, 117/95, 101, 102, 104, 105; 204/192.24, 204/192.15
  See application file for complete search history.

(56) References Cited

U.S. PATENT DOCUMENTS

| 5,096,882 A | 3/1992 | Kato et al. |
| 5,164,363 A | 11/1992 | Eguchi et al. |

(Continued)

FOREIGN PATENT DOCUMENTS

| DE | 19740964 | 3/1999 |
| EP | 0718897 | 6/1996 |

(Continued)

OTHER PUBLICATIONS

Shin et al, "Epitaxial, Ferromagnetic, Co Nanostructures within Insulating YSZ (100) Thin Films via Pulsed Layer Deposition on Si (100)," Symposium on Mukltifunctional Oxide, Materials Science & Technology Meeting, Oct. 25-29, 2009; Abstract.*

(Continued)

*Primary Examiner* — Stanley Silverman
*Assistant Examiner* — Kallambella Vijayakumar
(74) *Attorney, Agent, or Firm* — Novak Druce Connolly Bove + Quigg LLP

(57) ABSTRACT

A nanocomposite article that includes a single-crystal or single-crystal-like substrate and heteroepitaxial, phase-separated layer supported by a surface of the substrate and a method of making the same are described. The heteroepitaxial layer can include a continuous, non-magnetic, crystalline, matrix phase, and an ordered, magnetic magnetic phase disposed within the matrix phase. The ordered magnetic phase can include a plurality of self-assembled crystalline nanostructures of a magnetic material. The phase-separated layer and the single crystal substrate can be separated by a buffer layer. An electronic storage device that includes a read-write head and a nanocomposite article with a data storage density of 0.75 Tb/in$^2$ is also described.

25 Claims, 10 Drawing Sheets

(56) References Cited

U.S. PATENT DOCUMENTS

| | | | |
|---|---|---|---|
| 5,266,558 | A | 11/1993 | Lichtenberg et al. |
| 5,432,151 | A | 7/1995 | Russo et al. |
| 5,510,323 | A | 4/1996 | Kamo et al. |
| 5,543,630 | A | 8/1996 | Bliss et al. |
| 5,650,378 | A | 7/1997 | Iijima et al. |
| 5,739,086 | A | 4/1998 | Goyal et al. |
| 5,741,377 | A | 4/1998 | Goyal et al. |
| 5,801,105 | A | 9/1998 | Yano et al. |
| 5,846,912 | A | 12/1998 | Selvamanickam et al. |
| 5,872,080 | A | 2/1999 | Arendt et al. |
| 5,898,020 | A | 4/1999 | Goyal et al. |
| 5,958,599 | A | 9/1999 | Goyal et al. |
| 5,964,966 | A | 10/1999 | Goyal et al. |
| 5,968,877 | A | 10/1999 | Budai et al. |
| 6,036,774 | A * | 3/2000 | Lieber et al. .................. 117/105 |
| 6,074,990 | A | 6/2000 | Pique et al. |
| 6,077,344 | A | 6/2000 | Shoup et al. |
| 6,106,615 | A | 8/2000 | Goyal et al. |
| 6,114,287 | A | 9/2000 | Lee et al. |
| 6,147,033 | A | 11/2000 | Youm |
| 6,150,034 | A | 11/2000 | Paranthaman et al. |
| 6,151,610 | A | 11/2000 | Senn et al. |
| 6,154,599 | A | 11/2000 | Rey |
| 6,156,376 | A | 12/2000 | Paranthaman et al. |
| 6,159,610 | A | 12/2000 | Paranthaman et al. |
| 6,180,570 | B1 | 1/2001 | Goyal et al. |
| 6,190,752 | B1 | 2/2001 | Do et al. |
| 6,214,772 | B1 | 4/2001 | Iijima et al. |
| 6,231,779 | B1 | 5/2001 | Chiang et al. |
| 6,235,402 | B1 | 5/2001 | Shoup et al. |
| 6,261,704 | B1 | 7/2001 | Paranthaman et al. |
| 6,265,353 | B1 | 7/2001 | Kinder et al. |
| 6,270,908 | B1 | 8/2001 | Williams et al. |
| 6,331,199 | B1 | 12/2001 | Goyal et al. |
| 6,361,598 | B1 | 3/2002 | Balachandran et al. |
| 6,375,768 | B1 | 4/2002 | Goyal |
| 6,399,154 | B1 | 6/2002 | Williams et al. |
| 6,440,211 | B1 | 8/2002 | Beach et al. |
| 6,447,714 | B1 | 9/2002 | Goyal et al. |
| 6,451,450 | B1 | 9/2002 | Goyal et al. |
| 6,468,591 | B1 | 10/2002 | Paranthaman et al. |
| 6,486,100 | B1 | 11/2002 | Lee et al. |
| 6,537,689 | B2 | 3/2003 | Schoop et al. |
| 6,555,256 | B1 | 4/2003 | Christen et al. |
| 6,599,346 | B2 | 7/2003 | Goyal et al. |
| 6,602,313 | B2 | 8/2003 | Goyal et al. |
| 6,607,313 | B1 | 8/2003 | Farries et al. |
| 6,607,838 | B2 | 8/2003 | Goyal et al. |
| 6,607,839 | B2 | 8/2003 | Goyal et al. |
| 6,610,413 | B2 | 8/2003 | Goyal et al. |
| 6,610,414 | B2 | 8/2003 | Goyal et al. |
| 6,632,539 | B1 | 10/2003 | Iijima et al. |
| 6,635,097 | B2 | 10/2003 | Goyal et al. |
| 6,645,313 | B2 | 11/2003 | Goyal et al. |
| 6,657,229 | B1 | 12/2003 | Eguchi et al. |
| 6,663,976 | B2 | 12/2003 | Beach et al. |
| 6,670,308 | B2 | 12/2003 | Goyal |
| 6,673,646 | B2 | 1/2004 | Droopad |
| 6,716,795 | B2 | 4/2004 | Norton et al. |
| 6,740,421 | B1 | 5/2004 | Goyal |
| 6,756,139 | B2 | 6/2004 | Jia et al. |
| 6,764,770 | B2 | 7/2004 | Paranthaman |
| 6,782,988 | B2 | 8/2004 | Canacuzene et al. |
| 6,784,139 | B1 | 8/2004 | Sankar et al. |
| 6,790,253 | B2 | 9/2004 | Goyal et al. |
| 6,797,030 | B2 | 9/2004 | Goyal et al. |
| 6,846,344 | B2 | 1/2005 | Goyal et al. |
| 6,867,447 | B2 | 3/2005 | Summerfelt |
| 6,872,988 | B1 | 3/2005 | Goyal |
| 6,884,527 | B2 | 4/2005 | Groves et al. |
| 6,890,369 | B2 | 5/2005 | Goyal et al. |
| 6,899,928 | B1 | 5/2005 | Groves et al. |
| 6,902,600 | B2 | 6/2005 | Goyal et al. |
| 6,921,741 | B2 | 7/2005 | Arendt et al. |
| 6,956,012 | B2 | 10/2005 | Paranthaman et al. |
| 6,984,857 | B2 | 1/2006 | Udayakumar et al. |
| 7,087,113 | B2 | 8/2006 | Goyal |
| 7,090,785 | B2 | 8/2006 | Chiang et al. |
| 7,208,044 | B2 | 4/2007 | Zurbuchen et al. |
| 7,323,581 | B1 | 1/2008 | Gardiner et al. |
| 7,338,907 | B2 | 3/2008 | Li et al. |
| 7,341,978 | B2 | 3/2008 | Gu et al. |
| 7,553,799 | B2 | 6/2009 | Paranthaman et al. |
| 7,879,161 | B2 | 2/2011 | Goyal |
| 2003/0185741 | A1 | 10/2003 | Matyjaszewski et al. |
| 2004/0003768 | A1 | 1/2004 | Goyal |
| 2004/0095658 | A1 | 5/2004 | Buretea et al. |
| 2005/0239658 | A1 | 10/2005 | Paranthaman et al. |
| 2005/0239659 | A1 | 10/2005 | Xiong et al. |
| 2006/0234066 | A1 | 10/2006 | Zurbuchen |
| 2006/0276344 | A1 | 12/2006 | Paranthaman et al. |
| 2007/0071964 | A1 * | 3/2007 | Noda ............................ 428/323 |
| 2007/0178227 | A1 | 8/2007 | Hunt et al. |
| 2008/0176749 | A1 * | 7/2008 | Goyal ............................ 505/125 |
| 2008/0241581 | A1 | 10/2008 | Zurbuchen |
| 2009/0081456 | A1 | 3/2009 | Goyal |
| 2009/0088325 | A1 | 4/2009 | Goyal et al. |

FOREIGN PATENT DOCUMENTS

| | | |
|---|---|---|
| JP | 1065718 | 3/1987 |
| JP | 1100816 | 4/1989 |
| JP | 1100817 | 4/1989 |
| JP | 1220307 | 9/1989 |
| JP | 11025772 | 1/1999 |
| WO | 2008108606 | 9/2008 |

OTHER PUBLICATIONS

Ahn et al., "Heterogeneous Three-Dimensional Electronics by Use of Printed Semiconductor Nanomaterials," Science vol. 314, (2006) pp. 1754-1757.

Aytug et al., "Enhanced flux pinning in MOCVD-YBCO films through Zr additions: systematic feasibility studies," Superconductor Science and Technology, vol. 23, (2010), pp. 1-7.

Aytug et al., "Enhancement of Flux Pinning in YBa2Cu3O7—8 Films via Nano-Scale Modifications of Substrate Surfaces," Oak Ridge National Laboratory, Oak Ridge, TN 37831, ISBN: 978-1-60021-692-3, pp. 237-262, 2007.

Aytug et al., "ORNL-Superpower CRADA: Development of MOCVD-based IBAD-2G wires" 2008, Retrieved from URL: http://111.htspeereview.com/2008/pdfs/presentations/wednesday/2G/5_2g_ornl_superpower.pdf [retrieved on Oct. 21, 2010].

Aytug, "Deposition studies and coordinated characterization of MOCVD YBCO films on IBAD-MgO templates," Superconductor Science and Technology, vol. 22, (2009) p. 1.

Chen et al., "Metal Organic Chemical Vapor Deposition for the Fabrication of YBCO Superconducting Tapes," SuperPower Inc., Schenectady, NY 12304, ISBN: 978-1-60021-692-1, pp. 205-216, 2007.

Comini et al., "Quasi-one dimensional metal oxide semiconductors; Preparation, characterization and application as chemical sensors," Progress in Materials Science, vol. 54, No. 1 (2009) pp. 1-67.

Das et al., Novel nonlithographic quantum wire array fabrication: Physica E—Low-Dimensional Systems and Nanostructures, Elsevier Science BV, NL LNKD-DOI:10.1016/J.Physe.2005.10.015, vol. 36, No. 2, 3 (2007), pp. 133-139.

Duan et al., "Indium phosphide nanowires as building blocks for nanoscale electronic and optoelectronic devices," Optoelectronic Devices, Nature, vol. 409, (2001) pp. 66-69.

Gao, et al., Single and Binary Rare Earth $REBa_2Cu_3O_{7-\delta}$ Thin Films Prepared by Chemical Solution Deposition, J. Phys. Conf. Series, vol. 97, (2008) pp. 1-5.

Goyal et al., "Irradiation-free, columnar defects comprised of self-assembled nanodots and nanorods resulting in strongly enhanced flux-pinning in $YBa_2Cu_3O_{7-\delta}$ films," Superconductor Science and Technology, vol. 18, No. 11, (2005) pp. 1533-1538.

Goyal et al., "Self-assembled, ferromagnetic Co/YSZ nanocomposite films for ultrahigh density storage media," Abstract Submitted, Dec. 9, 2009.

(56) References Cited

OTHER PUBLICATIONS

Han et al., "Transition Metal Oxide Core-Shell Nanowires: Generic Synthesis and Transport Studies," Nano Letters, vol. 4, No. 7, (2004) pp. 1241-1246.

Harrington et al., "Self-assembled, rare earth tantalite pyrochlore nanoparticles for superior flux pinning in $YBa_2Cu_3O_{7-\delta}$ films," Superconductor Science and Technology, Issue 2 (2009), pp. 1-5.

Haugan et al., "In-Situ Approach to Introduce Flux Pinning in YBCO," Air Force Research Laboratory, ISBN: 978-1-60021-692-3, pp. 59-77, 2007.

Hikichi et al., "Property and Structure of $YBa_2Cu_3O_{7-x}$-$Nb_2O_5$ Composite," Journal of Applied Physics, vol. 31, (1992) L1234, col. 2 Paragraph 1.

Huang et al., "Room-Temperature Ultraviolet Nanowire Nanolasers," Science, vol. 292, (2001) pp. 1897-1899.

Javey et al., "Layer-by-Layer Assembly of Nanowires fore Three-Dimensional, Multifunctional Electronics," Nano Letters, vol. 7, No. 3 (2007) pp. 773-777.

Kang et al., "High-Performance High-$T_c$ Superconducting Wires," Science, DOI:10.1126/Science.1124872, vol. 331, No. 31 (2006), pp. 1911-SOM.

Kang et al., "Supporting material: High-performance H-$T_c$ Superconducting Wires," Science, vol. 331 (2006) 2 pp., col. 1, paragraph 3.

Kar et al., "Synthesis and Characterization of One-dimensional MgO Nanostructures," J. Nanosci. Nanotech, vol. 314, (2006) pp. 1447-1452.

Kita et al., "Effect of $Ta_2O_5$ addition on the superconducting properties of $REBa_2CU_3O_y$," Physica C: vol. 445-448, (2006) pp. 391-394.

Kuchibhatla et al., "One dimensional nanostructured materials," Progress in Materials Science, Pergamon Press, GB-LNKD DOI:10.1016/J.Pmatsci.2006.08.001, vol. 52, No. 5 (2007) pp. 699-913.

Le et al., Systematic studies of the epitaxial growth of single-crystal ZnO nanorods on GaN using hydrothermal synthesis,: Journal of Crystal Growth, Elsevier, Amsterdam, NL LNKD-DOI:10.1016/J.Jcrysgro.2006.04.082, vol. 293, No. 1 (2006) pp. 36-42.

Lei et al., "Highly ordered nanostructures with tunable size, shape and properties: A new way to surface non-pattering using ultra-thin alumina masks," Progress in Materials Science, Pergamon Press, GB LNKD-DOI: 10.1016/J.Pmatsci.2006.07.002, vol. 52, No. 4 (2007) pp. 465-539.

Liang et al., "Preparation of Free-Standing Nanowire Arrays on Conductive Substrates," J. Am. Chem. Soc. vol. 126 (2004) pp. 16338-16339.

Lu et al., "Quasi-one-dimensional metal oxide materials—Synthesis, properties and applications," Materials Science and Engineering R: Reports, Elsevier Sequoia S.A., Lausanne, CH LNKD-DOI:10.1016/J.Mser.2006.04.002, vol. 52, No. 103, (2006) pp. 49-91.

Ma et al., "Growth and properties of YBCO-coated conductors fabricated by inclined-substrate deposition," IEE Transactions on Applied Superconductivity, vol. 15, No. 2 (2005) pp. 2970-2973.

McIntyre et al., "Metalorganic deposition of high-$J_c Ba_2 YCu_3 O_{7-x}$ thin films from trifluoroacetate precursors onto (100) $SrTiO_3$," Journal of Applied Physics, vol. 68, No. 8 (1990) pp. 4183-4187.

Morales et al. "A laser Ablation Method for the Synthesis of Crystalline Semiconductor Nanowires," Science, vol. 279 (1998) pp. 208-211.

Nagashima et al., "Epitaxial Growth of MgO Nanowires by Pulsed Laser Deposition," J. Appl. Phys., vol. 101 (2007) pp. 124304-1 to 124304-4.

Pan et al., "Nanobelts of Semiconducting Oxides," Science, vol. 291, (2001) pp. 1947-1949.

Paranthaman et al., "Flux Pinning and AC Loss in Second Generation High Temperature Superconductor Wires," Oak Ridge National Laboratory, Oak Ridge, TN 37832, ISBN: 978-1-60021-692-3, pp. 3-10, 2007.

Pomar et al., "Enhanced vortex pinning in YBCO coated conductors with BZO nanoparticles from chemical solution deposition," IEEE Transactions on Applied Superconductivity, vol. 19, No. 3, (2009) pp. 3258-3261.

Saylor et al., "Experimental Method for Determining surface Energy Anisotropy and its Application to Magnesia," Journal of the American Ceramic Society, vol. 83, No. 5, (2004) pp. 1226-1232.

Selvamanickam et al., "High-current Y—Ba—Cu—O coated conductor using metal organic chemical-vapor Deposition, and ion-beam-assisted deposition," IEEE Transactions on Applied Superconductivity, vol. 11, No. 1 (2001) pp. 3379-3381.

Su et al., "Fabrication of thin films of multi-oxides ($YBa_2Cu_3O_{7-\delta}$) starting from nanoparticles of mixed ions," Superconductor Science and Technology, vol. 19, No. 11, (2006) pp. L51-L54.

Wang et al., "Growth of Nanowires," Mater. Sci. & Eng., vol. 60, No. 1-6 (2008) pp. 1-51.

Wee et al., "Enhanced flux pinning and critical current density via incorporation of self-assembled rare-earth barium tantalite nanocolumns with $YBa_2Cu_3O_{7-\delta}$ films," Physical Review B., vol. 81, No. 14 (2010) pp. 140503/1-14053/2.

Wee et al., "Formation of Self-Assembled, Double Perovskite, $Ba_2YNbO_6$ Nanocolumns and Their Contribution to Flux-Pinning and $J_c$ in Nb-Doped $YBa_2Cu_3O_{7-\delta}$ Films," Applied Physics Express, vol. 3, Issue 2, (2010) pp. 023101-023101-3.

Wee et al., "High Performance Superconducting Wire in High Applied Magnetic Fields via Nanoscale Defect Engineering," Superconductor Science and Technology, (2008) pp. 1-4.

Yamada et al., Reel-to-Reel Pulsed Laser Deposition of YBCO Thick Films, Nagoya Coated Conductor Center, Superconductivity Research Laboratory, ISTEC, 2-4-1, Mutsuno, Atsuta-ku, Nagoya, 456,-8587—Japan, ISBN 978-1-60021-692-3, pp. 95-119, 2007.

Yamada et al., "Towards the practical PLD-IBAD coated conductor fabrication—Long wire, high production rate and $J_c$ enhancement in a magnetic field," Physica C: vol. 445-448 (2006) pp. 504-508.

Yoo et al., "Electrocatalytic application of a vertical Au nanorod array using ultrathin Pt/Ru/Pt layer-by-layer coatings," Electrochimica ACTA, vol. 53, No. 1-3 (2007) pp. 3656-3662.

* cited by examiner

NANOCOMPOSITES FOR ULTRA HIGH DENSITY INFORMATION STORAGE, DEVICES INCLUDING THE SAME, AND METHODS OF MAKING THE SAME

CROSS-REFERENCE TO RELATED APPLICATIONS

This application claims priority to U.S. Patent Application No. 61/387,743, entitled "Nanocomposites for Ultra High Density Information Storage Media," filed Sep. 29, 2010, and is a continuation-in-part of U.S. patent application Ser. No. 12/850,521, filed Aug. 4, 2010, and is a continuation-in-part of U.S. patent application Ser. No. 12/850,398, filed Aug. 4, 2010, the entireties of which are incorporated by reference herein.

STATEMENT REGARDING GOVERNMENT SPONSORSHIP

This invention was made with government support under Contract Number DE-AC05-00OR22725 between the United States Department of Energy and UT-Battelle, LLC. The U.S. government has certain rights in this invention.

FIELD OF THE INVENTION

The present invention relates to phase-separated, heteroepitaxial, ferroic materials for ultra high density information storage, devices including the same, and methods of making the same.

BACKGROUND OF THE INVENTION

Considerable attention has been given to magnetic nanostructures, such as nanodots, nanotubes, nanowires, and nanocomposites for increasing magnetic disk drive capacities. However, as the size of magnetic particles is reduced to a critical value (typically a few tens of nanometer), the magnetic anisotropy energy per particle is comparable to the thermal energy, resulting in superparamagnetic (SP) behavior above the blocking temperature (BT). Such SP nanoparticles embedded in an insulating matrix can be magnetized rapidly by an external magnetic field with a lack of remanence and coercivity, properties which are attractive for magnetotransport and Coulomb blockade effect as well as biomedical applications due to their weak magnetic interaction. However, SP nanofeatures are not suitable for magnetic data storage since beyond the "superparamagnetic limit," thermal fluctuations at room temperature randomly flip the stored magnetic orientations. One approach reported for overcoming this limitation is to increase the magnetic anisotropy energy of the nanoparticles. Another approach reported is to increase the magnetic anisotropy of zero-dimensional nanomaterials with the extension of one-dimension, for example, from nanodots to nanowires. One-dimensional arrays of pre-patterned perpendicular magnetic nanofeatures such as nanowires, nanotube, and nanorods embedded in a nonmagnetic matrix has therefore been extensively investigated as the next-generation technology for ultra-high density magnetic recording media applications requiring capacities over 500 gigabit/in$^2$. The most popular method presently used for the fabrication of one-dimensional, perpendicular ferromagnetic nanowires is the electrodeposition of ferromagnetic metals into the pores of the oxide films as a template. However, this approach requires complex fabrication steps and will be expensive to scale-up.

SUMMARY OF THE INVENTION

A nanocomposite article that includes a single-crystal or single-crystal-like substrate and a heteroepitaxial, phase-separated layer supported by a surface of the substrate is described. The heteroepitaxial layer can include a continuous, non-magnetic, crystalline, matrix phase and an ordered magnetic phase disposed within the matrix phase. The ordered phase can include a plurality of self-assembled crystalline nanostructures of a magnetic material. The ordered magnetic phase can be discontinuous. The heteroepitaxial, phase-separated layer can include 1-99 vol-% of a non-magnetic material and 1-99 vol-% of a magnetic material. The single-crystal or single-crystal-like substrate can be silicon, e.g., silicon(100).

The nanocomposite article can also include a butler layer disposed between the substrate and the phase-separated layer. The matrix phase and the buffer layer can have the same composition.

The continuous, non-magnetic, crystalline, matrix phase can include a material selected from the group consisting of oxides, nitrides, carbides, borides, and combination thereof. The continuous, non-magnetic, crystalline matrix phase can include yttria-stabilized zirconia.

The ordered magnetic phase can include a ferromagnetic metal, a ferromagnetic compound, or both. The ordered magnetic phase can include cobalt.

An electronic storage device that includes a nanocomposite article as described herein and a read-write head for reading and/or writing information to the heteroepitaxial, phase-separated layer is also described. The read-write head can be adapted for at least one of longitudinal reading/writing and perpendicular reading/writing. The recording or data storage density of the nanocomposite article can be at least 0.75 Tb/in$^2$.

A method of forming the nanocomposite article described herein is also described. The method can include providing a single-crystal or single-crystal-like substrate having a surface and depositing the heteroepitaxial, phase-separated layer over the surface. The method can also include depositing a buffer layer over the substrate prior to depositing the heteroepitaxial layer.

The depositing step can include simultaneous deposition of the continuous, non-magnetic, crystalline, matrix phase, and the ordered magnetic phase via an epitaxial formation technique. The depositing step can include an in-situ deposition process selected from the group consisting of pulsed laser ablation, chemical vapor deposition (CVD), metallorganic chemical vapor deposition (MOCVD), sputtering and e-beam co-evaporation. The depositing step comprises an ex-situ deposition process selected from the group consisting of chemical solution processes, pulsed laser ablation, chemical vapor deposition (CVD), metallorganic chemical vapor deposition (MOCVD), sputtering and e-beam co-evaporation, followed by a heat treatment.

The target for the epitaxial formation technique can include a non-magnetic material and a magnetic material. The target for the epitaxial formation technique can include 1-99 vol-% of a non-magnetic material, and 1-99 vol-% of a magnetic material.

These and other embodiments are described in more detail below.

BRIEF DESCRIPTION OF THE DRAWINGS

A filler understanding of the present invention and the features and benefits thereof will be obtained upon review of the following detailed description together with the accompanying drawings, in which.

DETAILED DESCRIPTION OF THE INVENTION

A nanocomposite article useful for ultra high density data storage that includes a plurality of crystalline, magnetic nanostructures disposed in an ordered manner within a non-magnetic matrix phase is described. A storage device including the nanocomposite article and a method of making the nanocomposite article are also described. The inventors have determined that it is possible to produce a structure that is sufficiently ordered to allow ultra high density data storage (0.75 Tb/in$^2$ or greater) through simultaneous deposition of the magnetic nanostructures and the non-magnetic matrix phase. This development opens the door for efficient production of materials for ultra high density data storage.

Figure 3A:
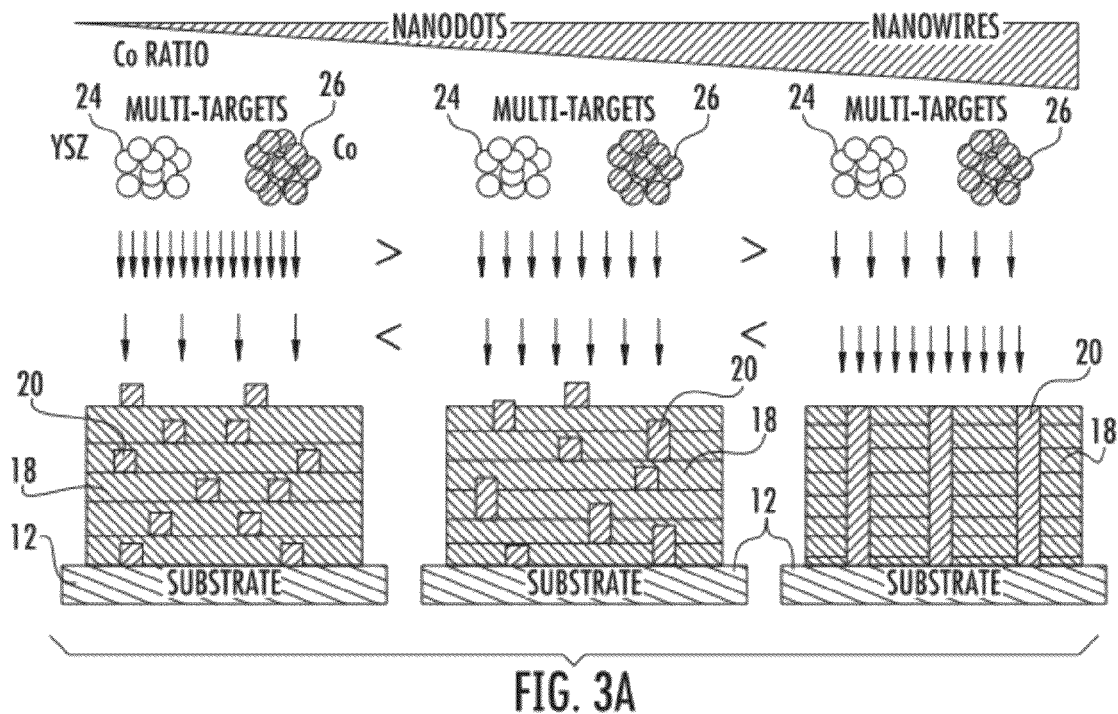
FIG. 3(a) Schematics: formation pathway of nanostructures dependent on the ablation ratio of Co to YSZ. (b) Corresponding the cross-sectional TEMs of Co/YSZ nanocomposite films: nanodots (left) and nanowires (right) embedded in YSZ matrices.

As shown in the Figures, a nanocomposite article 10 that includes a single-crystal or single-crystal-like substrate 12 having a surface 14 and a heteroepitaxial, phase-separated layer 16 supported by the surface is described. As shown schematically in FIG. 3(a) and optically in FIGS. 3(b), 4(a) and 5, the heteroepitaxial, phase-separated layer 16 can include a continuous, non-magnetic, crystalline, matrix phase 18, and an ordered magnetic phase 20 disposed within the matrix phase 20. The ordered magnetic phase 20 can be discontinuous. The ordered magnetic phase 20 can include a plurality of self-assembled crystalline nanostructures of a magnetic material. The nanostructures 20 can be nanodots, nanowires, nanorods, or combinations thereof.

As used herein, a first layer is "supported" on a second layer if the first layer is part of the same composite and is located above the second layer. As used herein, a first layer is "deposited" on a second layer if the first layer is above and in contact with the second layer. Thus, where a first layer is "supported" on a second layer, it is intended to encompass embodiments where the first layer is deposited on the second layer.

As used herein, "ordered" refers to a distribution that is not random. In particular, the nanostructures 20 can have a major axis aligned within 60 degrees of the c-axis of the phase-separated layer 16, within 45 degrees of the c-axis, or within 30 degrees of the c-axis. The nanostructures 20 can be arranged in columns through the thickness of the phase-separated layer 16. For example, the columns of nanostructures 20 can be arranged at an angle ranging between 0 and 60 degrees relative to the c-axis of the phase-separated layer 16, or between 0 and 45 degrees of the c-axis, or within 0 and 30 degrees of the c-axis.

As used herein, "self-assembled" refers to a self-ordering process that occurs spontaneously during growth of the relevant layer or film. It will be understood that any of the phase-separated morphologies described herein can be self-assembled through a variety of epitaxial deposition processes.

A unique aspect of the nanocomposite articles 10 described herein is the self-assembled arrangement of the nanostructures 20 produces articles capable of a recording or data storage density of at least 0.75 Tb/in$^2$, or at least 1 Tb/in$^2$, at least 1.25 Tb/in$^2$, or at least 1.5 Tb/in$^2$. This is due in part to unique, unexpected result that the self-assembled nanostructures 20 in the phase-separated layer 16 described herein exhibit desirable paramagnetic properties for data storage, i.e., stable magnetic orientations and high remanent magnetization even at operating temperatures. Examples of suitable materials for the substrate 12 include, but are not limited to, a single crystal substrate or a single crystal-like substrate. Exemplary single-crystal substrates 12 include silicon(100) or silicon (001). Exemplary single-crystal-like substrates include, but are not limited to, rock-salt and Wurtzite crystal structures.

The nanocomposite article 10 can also include a buffer layer 22 disposed between the substrate 12 and the phase-separated layer 16. There can be more than one buffer layer 22 disposed between the substrate and the phase-separated layer. Some or all of the buffer layers 22 can be uniaxially textured [e.g., (100), (010), or (001)] or biaxially textured. Some or all of the buffer layers 22 can be epitaxially deposited on the substrate 12. The matrix phase 18 and the buffer layer 22 can have the same composition, e.g., yttria-stabilized zirconia (YSZ), the same crystallographic orientations, or both.

As used herein, "biaxially textured" refers to materials having crystallographic orientations both parallel and perpendicular to the basal plane of a material, e.g., {100}<100>, including texture aligned along a first axis along the [001] crystal direction, and along a second axis having a crystal direction selected from the group consisting of [111], [101], [113], [100], and [010]. The degree of biaxial texture in the layer of which the biaxially textured surface, as specified by the FWHM of the out-of-plane and in-plane diffraction peak, is typically greater than 2° and less than 20°, preferably less than 15°, and optimally less than 10°.

With respect to the phase-separated layer 16, exemplary materials for the continuous, non-magnetic, crystalline, matrix phase 18 include, but are not limited to, yttria-stabilized zirconia, barium zirconate, barium titanate, lead zirconate titanate, and combinations thereof. Exemplary materials for the ordered magnetic phase 20 include, but are not limited to cobalt, iron, nickel, oxides thereof, and combinations thereof. The continuous, non-magnetic, crystalline matrix phase 18, the ordered magnetic phase 20, or both can have a uniaxial crystallographic orientation, e.g., (100), (010) or (001), or a biaxial crystallographic orientation.

The heteroepitaxial, phase-separated layer 16 can include 1-99 vol-% of a non-magnetic material, 25-98 vol-% of a non-magnetic material, 50-97 vol-% of a non-magnetic material, 60-96 vol-% of a non-magnetic material, or any range defined by any of these end-points, e.g., 25-99 vol-% or 96-99 vol-%. The heteroepitaxial, phase-separated layer 16 can include 1-99 vol-% of a magnetic material, 2-75 vol-% of a magnetic material, 3-50 vol-% a magnetic material, 4-40 vol-% of a magnetic material, or any range defined by any of these end-points, e.g., 2-40 vol-% or 1-4 vol-%. The ordered, magnetic phase 20 can be embedded or partially embedded in the non-magnetic, crystalline matrix phase 18. The ordered, magnetic phase 20 can be present in the form of nanostructures, such as nanorods, nanodots, nanowires, and combinations thereof. The nanostructures can be discontinuous, but present in an ordered array within the non-magnetic, crystalline, matrix phase.

Figure 3B:
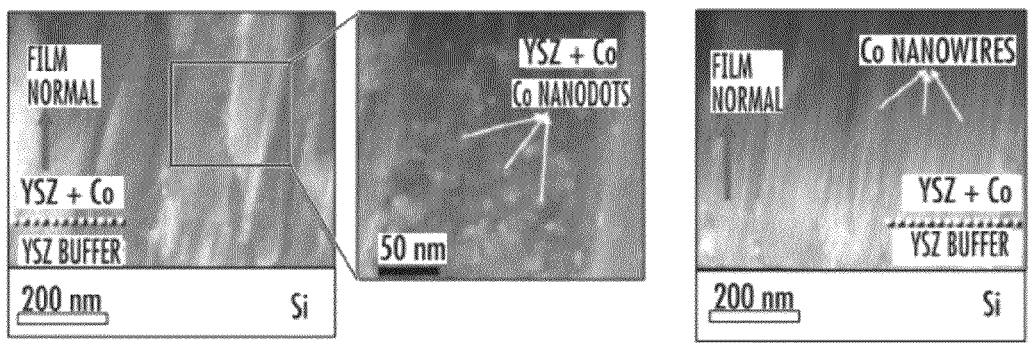
Figure 4A:
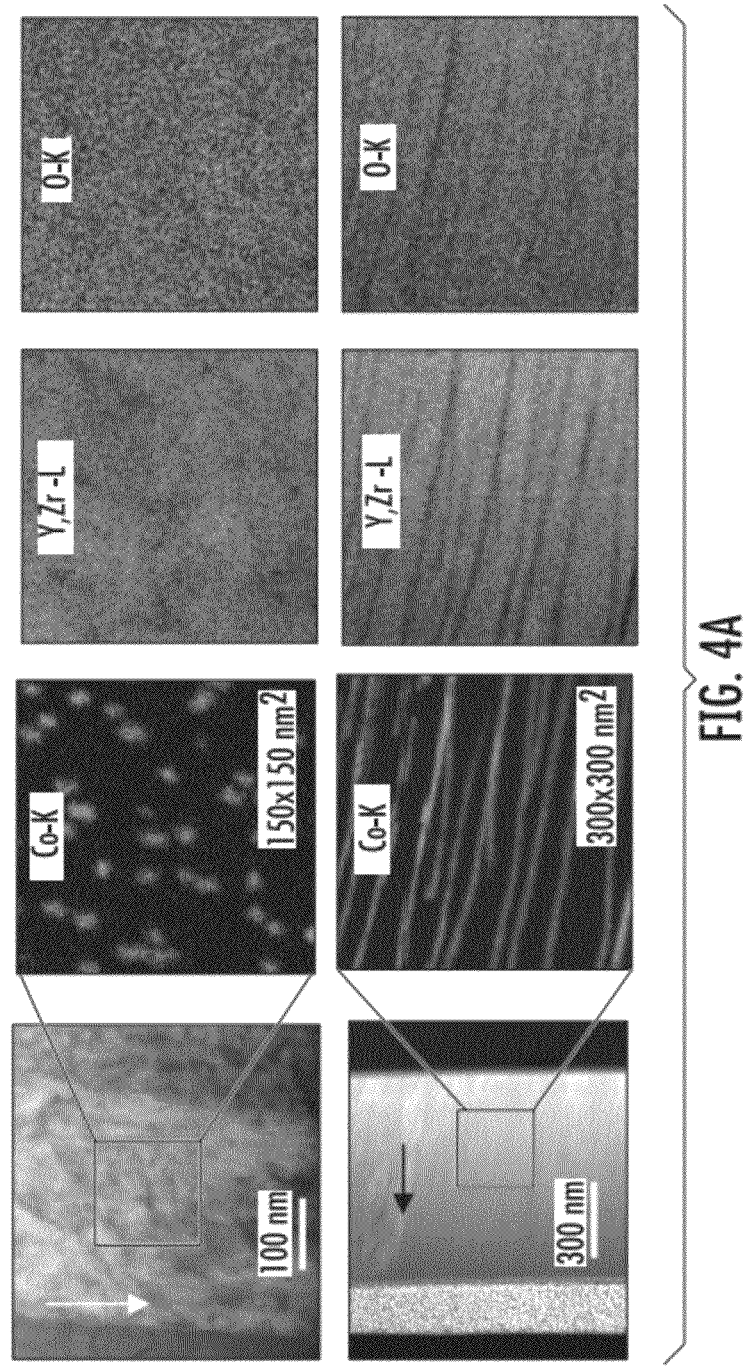
FIG. 4(a) Cross-sectional STEM images of Co nanodots (top) and nanowires (bottom) embedded in YSZ matrices with EDS elementary maps of Co, Y, Zr, and O in the region defined in the left hand side STEM images. XRD θ-2θ XRD scans of (b) YSZ buffer layer on Si substrate before the growth of Co/YSZ composite films and (c) Co nanodots, and (d) Co nanowires embedded in YSZ matrices on YSZ-buffered Si substrates. (e) The size distribution of nanodots: the frequency vs. the particle size.

For example, FIGS. 3(b) and 4(a) show images of exemplary phase-separated materials where the ordered, magnetic phase is present as a plurality of nanodots and other exemplary phase-separated materials where the ordered, magnetic phase is present as a plurality of nanowires that are embedded or partially embedded in a continuous first phase of YSZ.

The concentration or density of the nanostructures (i.e., nanorods, nanocolumns, nanodots and nanowires) in the non-magnetic, crystalline matrix phase can vary. In one aspect, the number density of ordered magnetic nanostructures can be between 400 and $4\times10^4$ per $\mu m^2$, which corresponds to interspacing distance between adjacent nanostructures in the range of 5 to 50 nm in the phase-separated layer.

The largest dimension (e.g., width or thickness) of the nanostructures 20 in the phase-separated layer 16 can generally be of nanoscale dimensions, i.e., less than 1 µm. For example, in different embodiments, the largest dimension of the nanostructures can be less than 500 nm, or less than 200 nm, or less than 100, 90, 80, 70, 60, 50, 40, 30, 20, or less than 10 nm. The smallest dimension of the nanostructures can be at least 0.01, 0.1, 0.5, 1, 2, 3, 4, 5, 10, 20 or 30 nm. The nanostructures can also have any combination of the aforesaid largest dimensions and smallest dimensions. However, smaller or larger thicknesses of the nanorod features are also possible. More typically, the largest dimension of the nanostructures is in the range of 1-100 nm, or 2-50 nm, or 3-40 nm.

The diameter of the nanodots can be between 1 nm and 50 nm. The diameter of the nanodots will depend on the type of processes and processing conditions used to deposit the phase-separated layer. In the case of columnar nanostructures, the length of the columns can be up to the entire film thickness of the phase-separate layer. The length will depend on the type of processes and processing conditions. The width of the nanorods or nanocolumns can be between 1 nm and 100 nm. The width of the nanorods or nanocolumns will depend on the type of processes and processing conditions. The nanodots can have an average diameter of 6-8 nm and can be separated by a distance of 15-30 nm from each other.

The volume ratio of the non-magnetic phase 18 to the ordered, magnetic phase 20 ranges from 1:99 to 99:1. In other exemplary phase-separated layers 16, the volume ratio of the non-magnetic phase 18 to the ordered, magnetic phase 20 can range from 2:98 to 98:2, or from 70:30 to 30:70, or from 80:20 to 20:80, or from 90:10 to 10:90. The volume ratio of the non-magnetic phase to the ordered, magnetic phase can be 2:1 or greater, or 3:1 or greater, or 4:1 or greater, or 7:1 or greater, or 9:1 or greater, or 14:1 or greater.

Figure 1A:
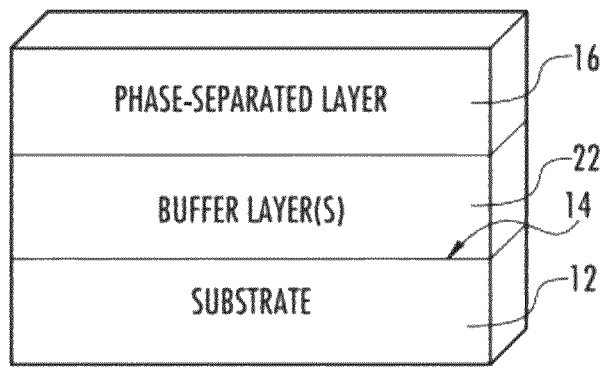
FIGS. 1A-C are schematics showing the layered nanocomposite article according to the invention.
Figure 1B:
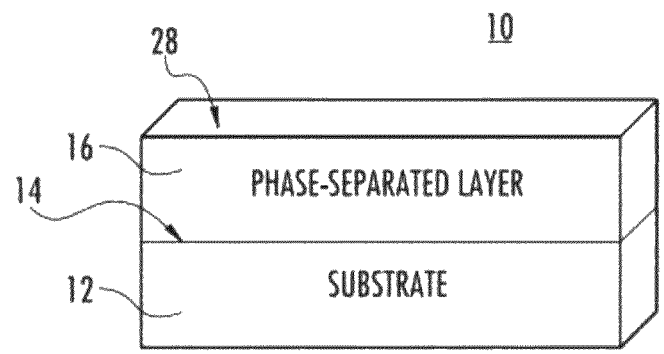
Figure 1C:
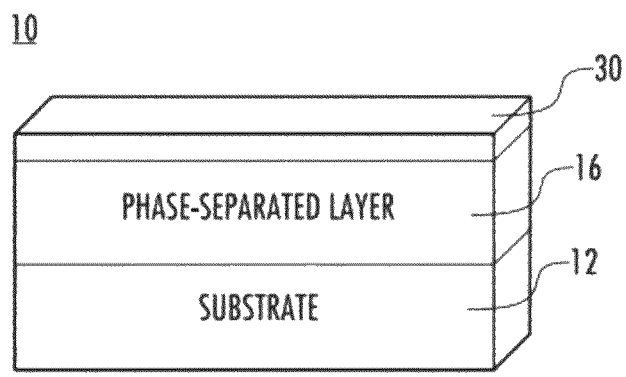
Figure 2A:
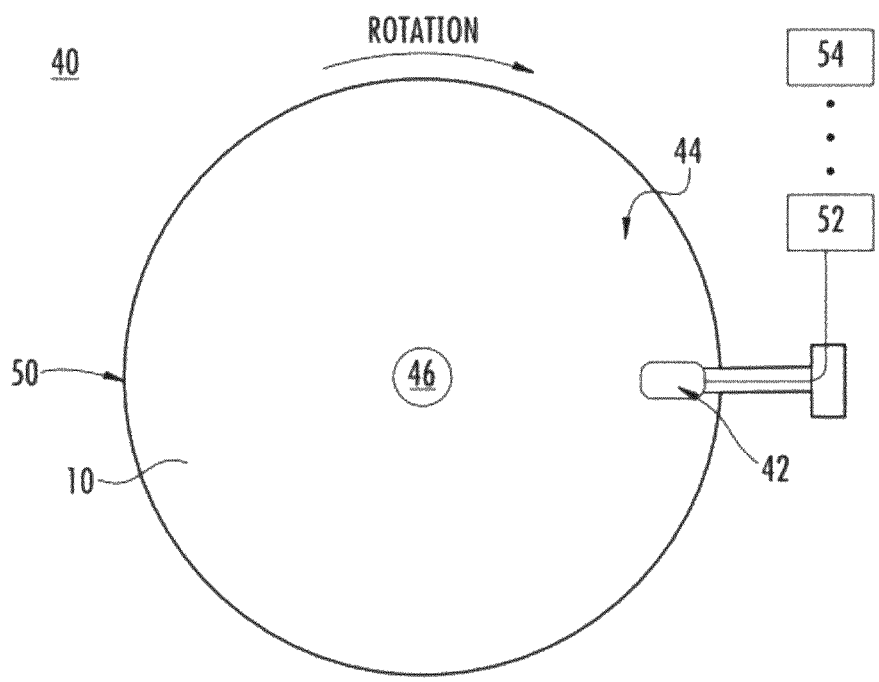
FIG. 2 is a schematic of the electronic storage device according to the invention.

As shown in FIGS. 2A and B, an electronic storage device 40 is also described. The electronic storage device 40 can include a nanocomposite article 10 including a phase separated material supported on a substrate as described herein and a read-write head 42 for reading and/or writing information to the heteroepitaxial, phase-separated layer of the nanocomposite article 10. The read-write head 42 can be adapted for longitudinal reading/writing. The read-write head 42 can also be adapted for perpendicular reading/writing in order to a take advantage of the ultra high density of the ordered, magnetic nanostructures.

Figure 2B:
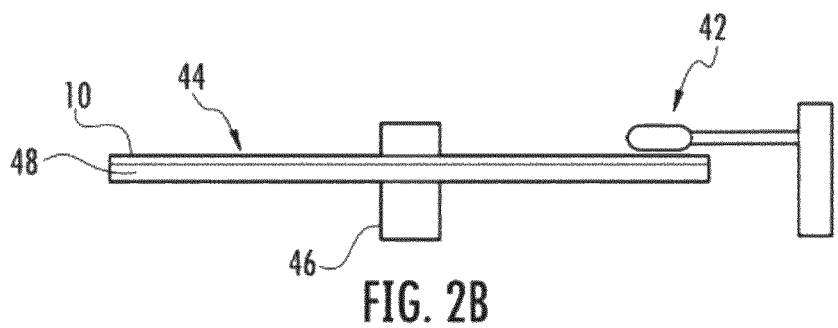

As best seen in FIG. 2B, the read-write head 42 can be positioned to float above an upper surface 44 of the nanocomposite article 10. The nanocomposite article 10 can have a circular shape and can be coupled to a shaft 46 adapted to rotate the nanocomposite article 10. In some embodiments, the nanocomposite article can be supported by or deposited on a support 48, e.g., a platter, which can have the same general shape as the nanocomposite article 10. The read-write head 42 can be adapted for moving from an inner portion of the circular nanocomposite article 10 adjacent the shaft 46 to an outer portion of the nanocomposite article 10 proximate the edge 50. The read-write head 42 can be communicatively coupled to a processor 52 adapted for sending and/or receiving information to and/or from an external source 54, e.g., a central processing unit of a computer. The coupling between the processor 52 and the external source 54 can be communicatively coupled to each other via any known wired or wireless method.

A method of forming the nanocomposite articles 10 described herein is also described. The method can include providing a single-crystal or single-crystal-like substrate 12 having a surface 14; and depositing a heteroepitaxial, phase-separated layer 16 over the surface 14. The phase-separated layer 16 can include a continuous, non-magnetic, crystalline, matrix phase 18 and an ordered, magnetic magnetic phase 20 disposed within the matrix phase 18 as already described herein. The method can also include forming one or more buffer layer 22 supported on the substrate 12 prior to forming the phase-separated layer 16, which is supported on the buffer layer(s) 16.

The depositing step can include simultaneous or sequential deposition of the continuous, non-magnetic, crystalline, matrix phase 18, and the ordered, magnetic magnetic phase 20 via an epitaxial formation technique. The depositing step can include an in-situ deposition process selected from the group consisting of pulsed laser ablation, chemical vapor deposition (CVD), metallorganic chemical vapor deposition (MOCVD), sputtering and e-beam co-evaporation. The depositing step can also include an ex-situ deposition process selected from the group consisting of chemical solution processes, and an ex-situ $BaF_2$ process, followed by a heat treatment. Finally, the depositing step can include a chemical solution process selected from the group consisting of TFA-MOD, non-fluorine MOD processes, and reduced fluorine MOD processes.

The target for the epitaxial formation technique can include both a non-magnetic material 24 and a magnetic material 26. The target can include 1-99 vol-% of the non-magnetic material, 25-98 vol-% of the non-magnetic material, 50-97 vol-% of the non-magnetic material, 60-96 vol-% of the non-magnetic material 24, or any range defined by any of these end-points, e.g., 25-99 vol-% or 96-99 vol-%. The target can include 1-99 vol-% of the magnetic material, 2-75 vol-% of the magnetic material, 3-50 vol-% of the magnetic material, 4-40 vol-% of the magnetic material 26, or any range defined by any of these end-points, e.g., 2-40 vol-% or 1-4 vol-%.

The method for producing the phase-separated layer can involve subjecting a target material that contains two or more target components to a sputtering technique (or other deposition technique disclosed herein, e.g., pulsed laser deposition) to form a phase-separated layer supported on a substrate. The target material should include both the magnetic material and the non-magnetic material or precursors thereof. In addition, the deposition technique should be operated under conditions appropriate for deposition of a phase-separated material that includes an ordered, magnetic magnetic phase. The characteristic of becoming phase-separated can be, for example, an inherent characteristic of the components (i.e., a propensity to phase-separate), or alternatively, a result of annealing or a reaction or interaction of the components with each other or another agent.

The phase-separated layer can be characterized by containing regions of different compositions, or more broadly, regions having different lattice structures, i.e., regions that are crystallographically dissimilar or mismatched. Regions of different compositions will necessarily possess different lattice structures.

Preferably, the crystallographically-mismatched regions, i.e., nanostructures, in the phase-separated layer have an ordered arrangement with respect to each other. The degree of order possessed by the phase-separated layer is preferably of the degree found in highly ordered self-assembled structures. For example, the order is preferably characterized by fixed or patterned distances (i.e., interspaces) between crystallographically matching regions (i.e., nanostructures) such as would be found in self-assembled (e.g., interdigitated or periodic) ordered materials. In some exemplary materials, the distances between crystallographically matching regions, e.g., nanostructures, are constant throughout the phase-separated layer. When the distances are patterned, the distances between at least a portion of the crystallographically matching regions are different, but follow an repeating pattern throughout the phase-separated layer.

In one embodiment, the fixed or patterned distances between nanostructures in the phase-separated layer 14 are on the nanoscale, such as a distance of about or no more than 1 nm, 2 nm, 3 nm, 4 nm, 5 nm, 10 nm, 20 nm, 30 nm, 40 nm, 50 nm, 60 nm, 70 nm, 80 nm, 90 nm, 100 nm, 150 nm, 200 nm, 250 nm, 300 nm, 350 nm, 400 nm, 450 nm, 500 nm, 550 nm, 600 nm, 650 nm, 700 nm, 750 nm, 800 nm, 850 nm, 900 nm, or 950 nm, or a distance within a particular range bounded by any two of the foregoing values. In another embodiment, the fixed or patterned distances between nanostructures in the phase-separated layer 14 are on the microscale, such as a distance of about or no more than 1 μm, 2 μm, 3 μm, 4 μm, 5 μm, 10 μm, 20 μm, 30 μm, 40 μm, 50 μm, 60 μm, 70 μm, 80 μm, 90 μm, 100 μm, 125 μm, 150 μm, 175 μm, 200 μm, 225 μm, or 250 μm, or a distance within a particular range bounded by any two of the foregoing values. In another embodiment, a portion of the fixed or patterned distances is within the nanoscale range while another portion of the fixed or patterned distances is within the microscale range.

The crystallographically mismatched regions, i.e., nanostructures, in the phase-separated layer can have any particular shape. For example, in different embodiments, at least one of the groups of phase-separated regions are substantially spherical (e.g., globules), or coin e.g., filamentous), or plate-like. In the particular case of columnar nanostructures, the columnar structures can be, for example, a cylindrical, square, rectangular, or triangular columnar structure, or a polygonal columnar structure (e.g., pentagonal, hexagonal, or other polygonal columnar shape). Furthermore, a cylindrical columnar shape includes ovoid or flattened cylindrical shapes.

In some exemplary nanocomposite articles, the phase-separated layer can be characterized by the presence of columnar or platelike phase-separated regions having their vertical axes (i.e., length-wise or longest axes, as opposed to shorter width-wise axes) oriented non-parallel to the ordered surface of the primary substrate and/or to the surface of the phase-separated layer. In some exemplary phase-separated layers 16, the ends of the ordered, magnetic nanostructures form a portion of the surface 28 of the phase-separated layer 16, white in exemplary other materials the ordered, magnetic nanostructures are completely embedded in the non-magnetic matrix phase.

The components in the target material 24, 26 need not be of equivalent chemical structure to the phases 18, 20 in the phase-separated layer 16. For example, the target components 24, 26 may react with each other or the primary substrate or with a gaseous reactive component during the deposition procedure to form a new phase-separated component 24, 26 in the phase-separated layer 16.

Each of the target components in the target material is necessarily present in a weight, volume, or molar percentage of less than 100% with respect to the total weight of target material. For example, in different embodiments, the percentage of one component, e.g., magnetic material 26 or non-magnetic material 24, can be about, or less than, or greater than 99%, 98%, 95%, 90%, 85%, 80%, 75%, 70%, 65%, 60%, 55%, 50%, 45%, 40%, 35%, 30%, 25%, 20%, 15%, 10%, 5%, 2%, or 1%, or within a range bounded by any two of the foregoing percentages. In the case where strictly two target components are used, the amount of magnetic target material can be represented as "A" while the amount of the non-magnetic target material can be represented as "100-A". In the case where three target components are used, the amount of the first and second target components can be represented as "A" and "B", respectively, while the amount of the third target material can be represented as "100-A-B" (and so on, for additional target components). By adjustment of the percentage of components in the target material, an adjustment can be made in the percentage of one component with respect to another component the deposited film. Accordingly, the spacing between and size of the nanostructures in the phase-separated layer can also be adjusted.

The two or more target components can be in a mixed or separated state during the deposition process, e.g., a sputtering or pulsed laser deposition process. In the mixed state, the target components can be mixed to any suitable degree of homogeneity. For example, a mixture of target components can be finely mixed (e.g., variable regions can be evident only on the microscale, i.e., less than 1 micron, or nanoscale), or coarsely mixed (e.g., variable regions are evident on a size scale greater than 1, 10, 100, or 500 microns). The target can also include a disk of one material covered with a foil of the second material.

Adjustments in the density, distribution, or size of the nanostructures in the phase-separated layer can provide a desired modulation of data storage properties. These adjustments can be achieved by judicious selection or adjustment of the conditions used in the deposition technique. The corresponding modulation of defects in the phase-separated layer can include, for example, an adjustment of the density distribution, interspacing, or columnar width, of or between defect features (including filaments) present in the superconducting film. Modulation of defects in the phase-separated layer can be used to form a data storage media, for example, which exhibit optimized data storage or ultra high data storage at an elevated blocking temperature ($T_B$).

As used herein, the "primary substrate" is the substrate upon which the phase-separated layer is deposited. Where a biaxially textured phase-separated material is desired, the primary substrate can be any suitable layer that contains an ordered surface, as particularly known and used in the field of epitaxial tapes and films, e.g., superconductor or semiconductor tapes. The ordered surface is typically a result of molecular-level organization, such as found in a crystalline or polycrystalline surface. The primary substrate can be a biaxially-textured substrate, such as any of the biaxially-textured substrates known in the art or described herein.

Any of the biaxially-textured substrates known in the art can be used as the primary substrate, e.g., buffer layer, on which the phase-separated layer is deposited. The term "biaxially-textured substrate" as used herein is meant to be synonymous with the related term "sharply biaxial-textured substrate."

Several types of biaxially-textured substrates are known, all of which are suitable for the purposes described herein. Biaxially-textured substrates suitable for use herein is the class of rolling assisted, biaxially-textured substrates (RABiTS). The RABiTS method produces a polycrystalline substrate having primarily low angle grain boundaries. Further details of the RABiTS technique and formed substrates can be found in, for example, A. Goyal, et al., *J. of Materials Research*, vol. 12, pgs. 2924-2940, 1997, and D. Dimos et al., *Phys. Rev. B*, 41:4038-4049, 1990, the disclosures of which are incorporated herein by reference.

The RABiTS technique provides a simple method for fabricating long lengths of biaxially-textured substrates with primarily low-angle grain boundaries. These substrates have been widely employed for the epitaxial deposition of high temperature superconducting (HTS) materials. A number of U.S. patents directed to the RABiTS process and related process variants have been issued. These include U.S. Pat. Nos. 5,739,086; 5,741,377; 5,846,912; 5,898,020; 5,964,966; 5,958,599; 5,968,877; 6,077,344; 6,106,615; 6,114,287; 6,150,034; 6,156,376; 6,151,610; 6,159,610; 6,180,570; 6,235,402; 6,261,704; 6,270,908; 6,331,199; 6,375,768; 6,399,154; 6,451,450; 6,447,714; 6,440,211; 6,468,591; 6,486,100; 6,599,346; 6,602,313; 6,607,313; 6,607,838; 6,607,839; 6,610,413; 6,610,414; 6,635,097; 6,645,313; 6,537,689; 6,663,976; 6,670,308; 6,675,229; 6,716,795; 6,740,421; 6,764,770; 6,784,139; 6,790,253; 6,797,030; 6,846,344; 6,782,988; 6,890,369; 6,902,600; and 7,087,113, the disclosures of which are incorporated herein by reference in their entireties. Of particular relevance in the above list of patents are U.S. Pat. Nos. 7,087,113, 5,739,086, 5,741,377, 5,898,020, 5,958,599 and 5,944,966.

In a preferred embodiment, a RABiTS substrate can be prepared as follows. Briefly, a deformed metal substrate with a very well-developed copper-type (Cu-type) rolling texture is first provided. The metal can be any suitable metal, and typically a FCC type of metal (e.g., Cu, Co, Mo, Cd, Pd, Pt, Ag, Al, Ni, and their alloys and more preferably, nickel and its alloys (e.g., NiW). A substrate with a Cu-type rolling texture can be readily identified, as known in the art, and as disclosed in, for example, U.S. Pat. No. 7,087,113. For example, a Cu-type rolling texture generally exhibits the characteristic that the X-ray intensity in the pole figures is concentrated on the β-fiber in Euler space of orientation representation. In other words, a Cu-type rolling texture is generally characterized by an orientation of all the grains in the material lying on the β-fiber. The β-fiber is defined as the tube or fiber running from the B through the S to the C point in Euler space. Cu-type rolling texture is generally best shown using pole figures of (111), (200), and (220) from the substrate or drawing the orientations in Euler Space. Next, the metal with Cu-type rolling texture is annealed at a temperature higher than its secondary recrystallization temperature to provide exaggerated grain growth such that a single grain consumes other grains to form an essentially single crystalline (i.e., single grain) type of material (hereinafter, a "single crystal substrate").

Typically, at least one buffer layer is epitaxially deposited on the surface of the single crystal substrate. The function of the buffer layer is typically as a chemical barrier between the single crystal substrate and the active (e.g., phase-separated) layer, thereby preventing reaction between these layers while epitaxially transmitting the ordered crystalline structure of the single crystal substrate to the superconducting layer. Exemplary buffer layers include, but are not limited to, $CeO_2$, yttria-stabilized zirconia (YSZ), $(RE)_2O_3$, wherein RE can be any rare earth metals [e.g., yttrium (Y), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), lutetium (Lu)], $LaM'O_3$, wherein M' is a transition or main group metal (e.g., $LaAlO_3$, $LaGaO_3$, $LaMnO_3$, $LaCrO_3$, $LaNiO_3$), lanthanum zirconate (e.g., $La_2Zr_2O_7$), $SrTiO_3$ (and its Nb-doped analog), $NdGaO_3$, $NbTiO_3$, MgO, TiN, $TiB_2$, Pd, Ag, Pt, and Au. Some common RABiTS architectures include, for example, a four-layer architecture, such as $CeO_2/YSZ/Y_2O_3/Ni/Ni$—W, and a three-layer architecture, such as $CeO_2/YSZ/CeO_2/Ni$—W.

Another type of biaxially-textured substrate includes the ion-beam-assisted deposition (IBAD) substrate. IBAD processes and resulting substrates are described in, for example, U.S. Pat. Nos. 6,632,539, 6,214,772, 5,650,378, 5,872,080, 5,432,151, 6,361,598, 5,872,080, 6,756,139, 6,884,527, 6,899,928, and 6,921,741, the disclosures of which are incorporated herein by reference in their entireties. Typically, an IBAD substrate is characterized by an MgO layer (i.e., "IBAD-MgO") biaxially grown using ion assist on an $Al_2O_3/Y_2O_3$-coated polycrystalline nickel-based alloy (generally, Hastelloy) base substrate. The Hastelloy substrate is typically deposited on a polycrystalline copper layer. The $Al_2O_3$ layer serves primarily as a barrier to prevent upward diffusion of substrate components (i.e., functions as a diffusion barrier layer) while the $Y_2O_3$ layer serves as a seed layer for the IBAD-MgO nucleation.

Yet another type of biaxially-textured substrate includes the inclined-substrate deposition (ISD) substrate. In the ISD process, the resulting substrate has rotated cube texture and the rotation can be as high as 40-45°. ISD processes and resulting substrates are described in, for example, U.S. Pat. Nos. 6,190,752 and 6,265,353, the disclosures of which are incorporated herein by reference in their entireties. In both the IBAD and ISD processes, a biaxially-textured layer is deposited on a flexible, polycrystalline, untextured substrate.

The primary substrate considered herein possesses a textured typically, biaxially-textured) surface upon which the phase-separated layer is deposited. The ordered surface can be, for example, any of the layers described above that are typically included in a biaxially textured primary substrate, such as found in a RABiTS, IBAD, or ISD substrate. For example, the surface may be a crystalline or polycrystalline (e.g., epitaxial) layer of a metal oxide (e.g., $CeO_2$, $ZrO_2$, $Al_2O_3$, $Y_2O_3$, or YSZ), metal (e.g., Ni, Cu), or metal alloy (e.g., Ni—W). In a particular embodiment, the surface is a crystalline, polycrystalline, or epitaxial layer of an alkaline earth metal oxide, such as YSZ.

The primary substrate surface on which the phase-separable components are epitaxially deposited can influence an effect on the growth mechanisms of the phase-separated components. Accordingly, the primary substrate surface can be appropriately selected or modified in order to adjust, modulate, or optimize crystallographic and other morphological characteristics of the epitaxially-grown phase-separated layer.

Where sputtering is used, the sputtering deposition technique can be any of the deposition techniques known in the art in which a target material and substrate are made to assume opposite polarities within a reduced pressure atmosphere at a voltage difference sufficient to induce gas-phase sputtering of the target material, thereby resulting in the ejection of atoms of the target material and their deposition on the substrate. The invention incorporates by reference all of the knowledge in the art pertaining to the concept, design, and operation of sputtering techniques useful for deposition of a film onto a substrate, as treated by, for example, K. Wasa, S. Hayakawa, *Handbook of Sputter Deposition Technology, Principles, Technology and Applications*, Noyes Publications, (c) 1992, and *Glow Discharge Processes, Sputtering and Plasma Etching*, John Wiley & Sons, Inc., (c) 1980, of which the contents pertaining to sputtering deposition techniques are incorporated herein in their entirety.

As is well known in the art, a sputtering process operates by the general principle that the voltage established between the target material and substrate causes an acceleration of electrons, which, in turn, causes ionization of the gaseous medium (sputter gas) as the electrons collide with gas molecules. The resulting ionized gas molecules, which are positively charged, are made to accelerate toward the target material when the target material is held at a negative charge. The impact of the ionized gas molecules on the target material causes the ejection of atoms of the target material and their deposition onto the substrate.

Where sputtering is used, the sputtering deposition technique can be a direct current (DC) sputtering technique, a polarity-oscillating technique, such as a radiofrequency (RF) sputtering technique, or an ion-beam sputtering (IBS) technique. Any of the sputtering deposition techniques contemplated herein can, in addition, be a magnetron sputtering technique.

As used herein, a "magnetron sputtering technique" is any sputtering technique in which electrons (and resulting ions of sputter gas) are confined in a region near the target surface by a magnetic (or electromagnetic) field. The magnetic field (typically of several hundred gauss) can be established by, for example, placing a permanent magnet or solenoid near or within a cathode target. As known in the art, the precise magnitude of the magnetic field employed depends to a large extent on the distance from the cathode target (sputtering gun). By confining the electrons close to the target, a significantly increased amount of ionizing collisions occurs near the target surface as compared to the amount of collisions that occur without the magnetic-induced confinement. The increased ionizing collisions advantageously results in a significantly increased sputtering rate of the target material, and hence, a significantly increased deposition rate, as compared to sputtering techniques that do not include a magnetic-induced confinement.

Preferably, regardless of the deposition technique, the technique employs means to adjust the distance between the target 24, 26 and substrate 12. In preferred embodiments, the depositions are conducted with the substrate being about 4, 5, or 6 cm (and more preferably, about 5 cm) above the cathode target.

Two magnetron sputtering techniques particularly considered herein are DC magnetron sputtering and RF magnetron sputtering. In the DC magnetron sputtering technique, a DC sputtering technique, as described above, is modified by also including magnetic confinement of electrons close to the target. In the RF magnetron sputtering technique, a RF sputtering technique, as described above, is modified by also including magnetic confinement of electrons close to the target. The magnetron sputtering system can have any of the designs and arrangements known in the art, such as a cylindrical type or planar type magnetron sputtering system.

Any of the sputtering deposition techniques contemplated herein can, in addition, be a reactive sputtering technique. In a reactive sputtering technique, sputtered material chemically reacts with (and generally, combines with) at least some portion of the gaseous medium. Two reactive sputtering techniques particularly considered herein are DC reactive sputtering and RF reactive sputtering. In the DC reactive sputtering technique, a DC sputtering technique, as described above, is modified by also including in the gaseous medium one or more gaseous components that react with the sputtered target material. In the RF reactive sputtering technique, a RF sputtering technique, as described above, is modified by also including in the gaseous medium one or more gaseous components that react with the sputtered target material. By the same principle, the reactive sputtering technique can also be a magnetron sputtering technique, such as a DC reactive magnetron sputtering technique or a RF reactive magnetron sputtering technique.

Any of the sputtering deposition techniques contemplated herein can, in addition, be modified to operate in a pulsed mode. The pulsed sputtering technique can be, for example, a pulsed DC sputtering technique, such as bipolar pulsed DC sputtering, or a pulsed magnetron sputtering technique, such as high power impulse magnetron sputtering (HIPIMS).

The sputter gas is generally composed, in at least a major proportion, of an inert gas. The inert gas particularly considered herein is a noble gas, most notably argon (Ar), or alternatively, helium (He), neon (Ne), krypton (Kr), or xenon (Xe). Nitrogen ($N_2$) can also be an inert gas when used with a target material not reactive with nitrogen. Some other gases that may be used, either as an inert or reactive gas (depending on the conditions), include hydrogen ($H_2$), oxygen ($O_2$), carbon dioxide ($CO_2$), carbon monoxide (CO), water ($H_2O$), ammonia ($NH_3$), a nitrogen oxide (e.g., NO, $NO_2$, $N_2O$), ozone ($O_3$), a sulfur oxide (e.g., $SO_2$), hydrogen halide (e.g., HF or HCl), or a gaseous hydrocarbon or fluorocarbon (e.g., $CH_4$, $CH_2F_2$, $CF_4$, $C_2H_6$, $C_2F_6$). A combination of any two or more of these gases may also be used. Some particular combinations of sputter gases considered herein include argon-hydrogen (e.g., Ar-4% $H_2$), argon-oxygen (e.g., Ar-4% $O_2$), argon-nitrogen (e.g., Ar-10% $N_2$), argon-water, nitrogen-hydrogen, nitrogen-oxygen, nitrogen-water, $CF_4$-nitrogen, $CF_4$-hydrogen, $CF_4$-oxygen, and $CF_4$—$H_2O$ mixtures. In particular, water vapor may be included in minute amounts (e.g., $1-5 \times 10^{-5}$ Torr, or a sub-range therein) in order to oxidize a sputtered target material such that the stoichiometric ratio of non-oxygen to oxygen elements is suitably adjusted or optimized.

The sputtering techniques considered herein are generally conducted at a reduced pressure. Generally, the pressure is reduced to a pressure less than about $120 \times 10^{-3}$ Torr (i.e., 120 mTorr). In different embodiments, depending on the type of sputtering technique being used, the operating pressure can preferably be about, at least, or no more than 110, 100, 90, 80, 70, 60, 50, 40, 30, 20, 15, 12, 11, 10, 9, 8, 7, 6, 5, 4, 3, 2, 1, 0.5, 0.4, 0.3, 0.2, 0.1, 0.05, or 0.01 mTorr, or a pressure within a range bounded by any two of the foregoing exemplary values. Typically, a DC sputtering technique is practiced using an operating pressure at or above 30 mTorr. Typically, a RF sputtering technique or magnetron sputtering technique is practiced using an operating pressure below 30 mTorr. In addition to the operating pressure, the sputtering technique can employ a suitable base pressure (i.e., background pressure of the system). Typically, a suitable base pressure is no more than about $5 \times 10^{-5}$ Torr. For example, in different embodiments, the base pressure can be about, at least, or no more than $4 \times 10^{-5}$ Torr, $3 \times 10^{-5}$ Torr, $2 \times 10^{-5}$ Torr, $1 \times 10^{-5}$ Torr, $9 \times 10^{-6}$ Torr, $8 \times 10^{-6}$ Torr, $7 \times 10^{-6}$ Torr, $6 \times 10^{-6}$ Torr, $5 \times 10^{-6}$ Torr, $4 \times 10^{-6}$ Torr, $3 \times 10^{-6}$ Torr, $2 \times 10^{-6}$ Torr, or $1 \times 10^{-6}$ Torr, or a base pressure within a range bounded by any two of the foregoing exemplary values.

In the sputtering deposition method considered herein, the substrate is typically heated in order to make the deposition process more efficient. The temperature at which the substrate is heated is also referred to as the "sputter temperature". Generally, a sputter temperature of at least 500° C. is employed. In different embodiments, the sputter temperature can preferably be about, at least, or no more than 400° C., 425° C., 450° C., 475° C., 500° C., 525° C., 550° C., 575° C., 600° C., 625° C., 650° C., 675° C., 700° C., 725° C., 750° C., 775° C., 800° C., 825° C., 850° C., 875° C., or 900° C., or a sputter temperature within a range bounded by any two of the foregoing exemplary values. In one embodiment, the sputter temperature is maintained at a specific temperature, or substantially maintained at a specific temperature (i.e., within ±5° C. of a specific temperature), during the sputtering operation. In another embodiment, the sputter temperature is changed (i.e., by more than ±5° C.) during the sputtering operation. In different embodiments, the sputter temperature is increased, or decreased, or increased to a peak temperature and decreased, or decreased to abuse temperature and then increased, during the sputtering operation. In some embodiments, the sputter temperature is changed at a constant or substantially constant rate (i.e., linear or substantially linear rate), while in other embodiments, the sputter temperature is changed by a changing (i.e., non-linear) rate during the sputtering process.

The sputtering time (i.e., time that target is being sputtered and deposited on substrate) is very much dependent, first, on the desired thickness of the film (i.e., longer sputtering times generally produce thicker films), and second, on the conditions employed (e.g., sputtering pressure, sputter temperature, sputtering power, and overall sputtering efficiency) in the sputtering technique. Accordingly, in some embodiments, the sputtering time can be as short as a few minutes (e.g., 1, 2, 3, 4, 5, 10, or 15 minutes), while in other embodiments, the sputtering time can be, for example, 20, 30, 40, 50, 60, 70, 80, 90, 100, 110, 120, 150, 180 minutes, or more.

Regardless of deposition technique, the thickness of the phase-separated layer is, generally, desirably at least 5 nm thick. In different embodiments, the phase-separated layer 14 can be about, at least, or no more than 5 nm, 10 nm, 15 nm, 20 nm, 25 nm, 30 nm, 40 nm, 50 nm, 60 nm, 70 nm, 80 nm, 90 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 310 nm, 320 nm, 330 nm, 340 nm, 350 nm, 360 nm, 370 nm, 380 nm, 390 nm, 400 nm, 410 nm, 420 nm, 430 nm, 440 nm, 450 nm, 460 nm, 470 nm, 480 nm, 490 nm, 500 nm, 550 nm, 600 nm, 650 nm, 700 nm, 750 nm, 800 nm, 850 nm, 900 nm, 950 nm, 1000 nm, 1100 nm, 1200 nm, 1300 nm, 1400 nm, or 1500 nm, or a thickness within a range bounded by any two of the foregoing values.

The sputter power is generally at least 20 Watts (20 W). In different embodiments, the sputter power is about, at least, or no more than about 20, 30, 40, 50, 60, 70, 80, 90, 100, 110, 120, 130, 140, 150, 160, 170, 180, 190, or 200 Watts, or a power within a range bounded by any two of the foregoing values.

The sputter power and other conditions are preferably adjusted such that a deposition rate of at least 0.01 nm/s is attained. In different embodiments, conditions of the sputtering process are adjusted such that a deposition of about or at least 0.01, 0.02, 0.03, 0.04, 0.05, 0.06, 0.07, 0.08, 0.09, 0.10, 0.11, 0.12, 0.13, 0.14, 0.15, 0.16, 0.17, 0.18, 0.19, or 0.20 nm/s is attained.

In some exemplary methods, a pre-annealing step can be performed on the primary substrate prior to deposition of the target material on the substrate. In a typical pre-annealing step, the primary substrate is placed in a closed chamber (e.g., the deposition chamber), an annealing gas (preferably, any of the inert sputtering gases described above) is introduced into the chamber, and the pressure is reduced to a suitable low pressure, such as 1, 2, or 3 mTorr, or any of the low pressures described above. The temperature of the primary substrate can be simultaneously or subsequently increased to a suitable annealing temperature (e.g., 700° C., 720° C., or 740° C., or any of the elevated temperatures described above for the sputter temperature). The temperature is preferably increased at a set rate, such as 80° C./min., 90° C./min., 100° C./min., 110° C./min., 120° C./min., 130° C./min., 140° C./min., or 150° C./min. Once the primary substrate reaches the desired annealing temperature, the primary substrate is preferably maintained at the annealing temperature for at least, for example, 10, 15, 30, or 45 minutes, depending on the annealing temperature and other factors.

After a phase-separated layer has been deposited on the primary substrate, the primary substrate is typically cooled to a suitable cooled temperature. The suitable cooled temperature is typically room temperature, which is typically a temperature within about 15-30° C., or about 25° C. In some embodiments, the primary substrate is rapidly cooled (e.g., at a rate of at least 10, 15, 20, 30, 40, or 50° C./min., or within a range therein), while in other embodiments, the primary substrate is more slowly cooled (e.g., at a rate if less than 10° C./min., or about 5, 4, 3, 2, or 1° C./min., or within a range therein).

Regardless of the deposition technique used, the resulting primary substrate with deposited phase-separated layer 16 can be subjected to a post-processing step. The post-processing step can function, for example, to promote, modify, adjust, or optimize a phase separation of components. The post-processing step can be a heating step, cooling step (i.e., below room temperature), pressurization, depressurization, radiation exposure step (e.g., UV, microwave, electron beam, or ion beam radiation), or a chemical exposure step (e.g., contact of the treated substrate with a vapor phase or liquid phase chemical or mixture of chemicals). In one embodiment, the post-processing step is conducted on the treated substrate while the treated substrate is at the temperature assumed upon completion of the sputtering deposition process. In another embodiment, the post-processing step is conducted on the treated substrate after it has been cooled to, for example, room temperature, and post-processed either in the cooled state or in a subsequently elevated temperature state.

Regardless of the deposition technique used, the post-processing step can include a heating step, such as a post-annealing step. The heating may be conducted at typical ambient pressure (e.g., 1 atm), reduced pressure (e.g., a pressure below 1 atm, or any of the reduced pressures described above), or elevated pressure (e.g., greater than 1 atm). The heating can be conducted under any suitable atmosphere, such as air, or alternatively, an artificial inert or reactive gas, such as any of the sputter gases and combinations thereof described above. The post-annealing temperature is preferably any of the sputter temperatures described above (e.g., 750-800° C.). The post-annealing time is dependent on several factors, including the applied temperature. In different embodiments, the post-annealing time can be any of the sputtering times given above (e.g., 15 minutes to 2 hours). After the post-annealing step, the treated substrate can be cooled in a gradual or rapid manner, such as described above after sputtering is completed.

A coating 30 can be applied to the phase-separated layer 16 for any of a variety of purposes. For example, a protective layer 30 may be applied on the phase-separated layer 16 to protect the phase-separated layer 16, such as for corrosion resistance. Alternatively, a coating 30 (e.g., metallic, polymeric, plastic, rubber, paint, or hybrid) can be applied onto the phase-separated layer 16 to provide, for example, electrical or magnetic insulation, or a certain level of rigidity or flexibility.

Examples have been set forth below for the purpose of illustration and to describe the best mode of the invention at the present time. However, the scope of this invention is not to be in any way limited by the examples set forth herein.

EXAMPLES

Sample Preparation

Epitaxial, self-assembled ferromagnetic cobalt nanostructures embedded in yttria-stabilized zirconia (YSZ) matrix were grown on YSZ (001)-covered singe-crystalline Si (001) substrates by pulsed laser deposition (PLD). For the examples described below, high quality epitaxial YSZ buffered layers of ~120 nm thickness were grown on Si (001) substrates using pulsed layer deposition. The PLD source was a KrF ($\lambda$=248 nm) excimer laser at a repetition rate of 10 Hz and additional PLD properties of interest included temperature of 800° C. and a pressure of $5\times10^{-4}$ Torr $O_2$.

Phase-separated Co/YSZ nanocomposite films were then deposited on the YSZ-buffered Si (001) substrates using pulsed laser deposition (PLD). Self-assembled Co nanodots and Co nanowires embedded in YSZ matrices were grown on the YSZ-buffered Si(001) substrates under a 4% $H_2$/96% Ar atmosphere at the growth temperature 800° C. and a growth pressure of 1 mTorr. Laser energy density and the distance between substrate and target were set to 4 $J/cm^2$ and 6.5 cm, respectively.

To obtain the diverse formation of Co nanostructures, a multi-target system was used. The multi-target system was a YSZ ceramic target (2" diameter) partly covered with a strip of a high-purity Co foil. The width was 0.4 cm for nanodots and 0.9 cm for nanowires. After deposition of the phase-separated layer, all samples were cooled down to room temperature at a cooling rate of 20° C./min.

To study the microstructure and composition of the films, transmission electron microscopy (Hitachi HF-3300 TEM) TEM and energy dispersive x-ray spectroscopy (EDS) were used. Phase and texture analysis were carried out using a Picker 4-circle diffractometer with CuK$\alpha$ radiation. Field-dependent magnetic measurements were obtained using a superconducting quantum interference device (SQUID).

Discussion and Results

YSZ was chosen as the buffer layer to enable heteroepitaxy in both Co nanostructures and YSZ matrix. As shown in FIG. 3, the formation of nanostructures from nanodots to nanowires was controlled by the ablation of Co and YSZ in different Co/YSZ ratios using a multi-target system of YSZ ceramic target partly covered with high-purity metallic Co stripes of different widths. Cross-section transmission electron microscopy (TEM) and Z-contrast scanning transmission electron microscopy (STEM) analyses confirmed the presence of nanostructures embedded in the YSZ matrices and their varying morphology as a function of the ratio of Co and YSZ during the ablation process.

As shown by the STEM images of FIG. 3(b), a nearly 120 nm-thick YSZ buffer layer was observed at the base of both nanocomposite films, which had a thickness in the range 650-700 nm. The self-assembly of nanodots and nanowires is evident from these images, which show a uniform distribution of both types of nanostructures through the entire film thickness. In particular, the nanowires resemble nearly straight columns that extend nearly vertically (i.e., along the c-axis) continuously throughout the film.

Figure 4B:
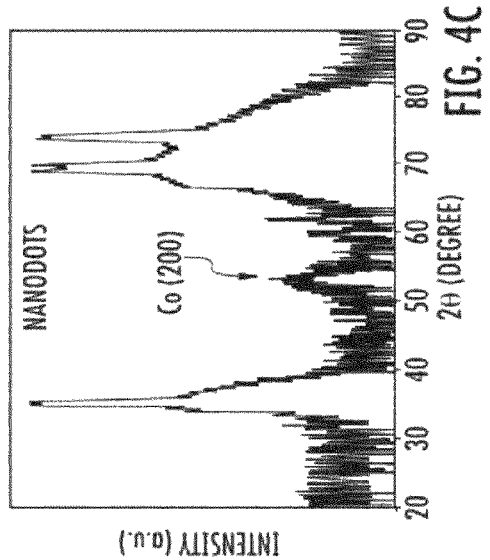
Figure 4C:
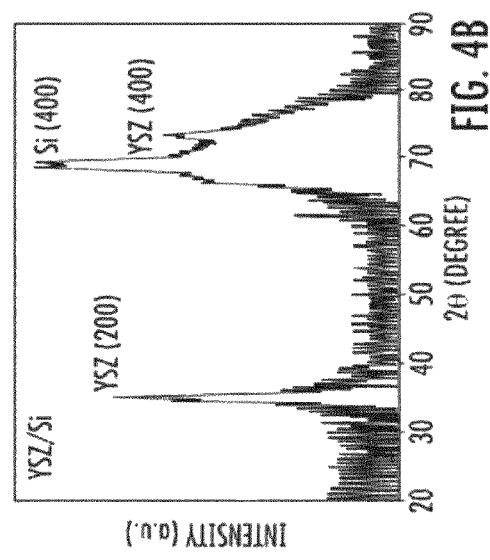
Figure 4D:
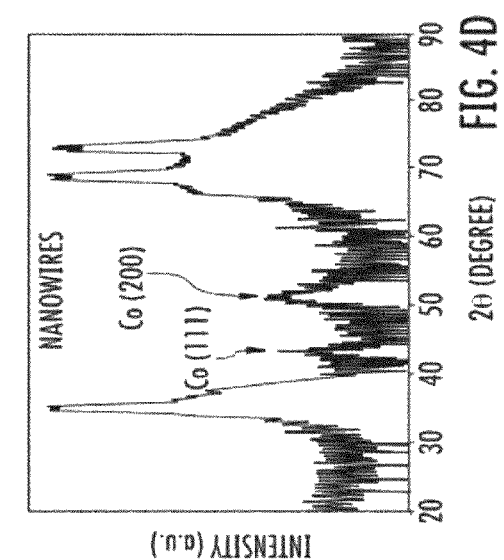
Figure 4E:
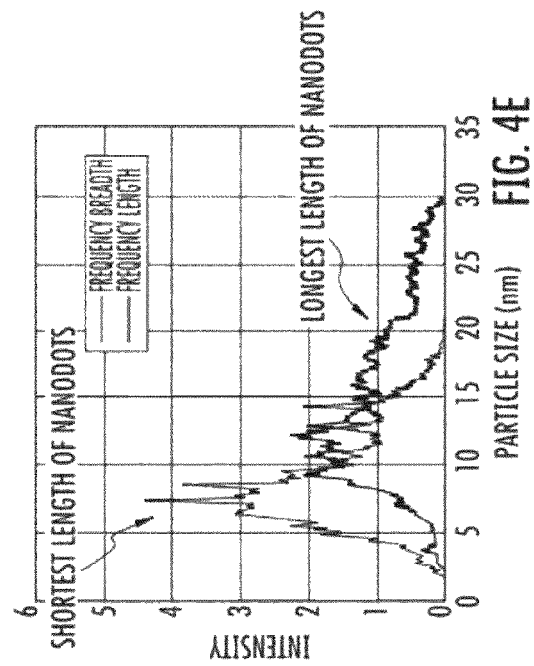

FIG. 4(e) shows an analysis demonstrating a slight asymmetry in the shape of nanodots. In particular, the dimension along the growth direction i.e., c-axis) is slightly larger than the orthogonal dimension. This is shown schematically in the second inset of FIG. 3(a). In addition, FIG. 4(e) shows that the maximum frequency for the breadth (shortest dimension) of the nanodots is approximately 7 nm, whereas the maximum frequency for the length (longest dimension) of the nanodots is approximately 12 nm. In addition, the distribution of the nanodots length is broader than that of the breadth, which indicates that the elongated axis of the nanodots varies within a wide range along the growth direction.

Figure 5:
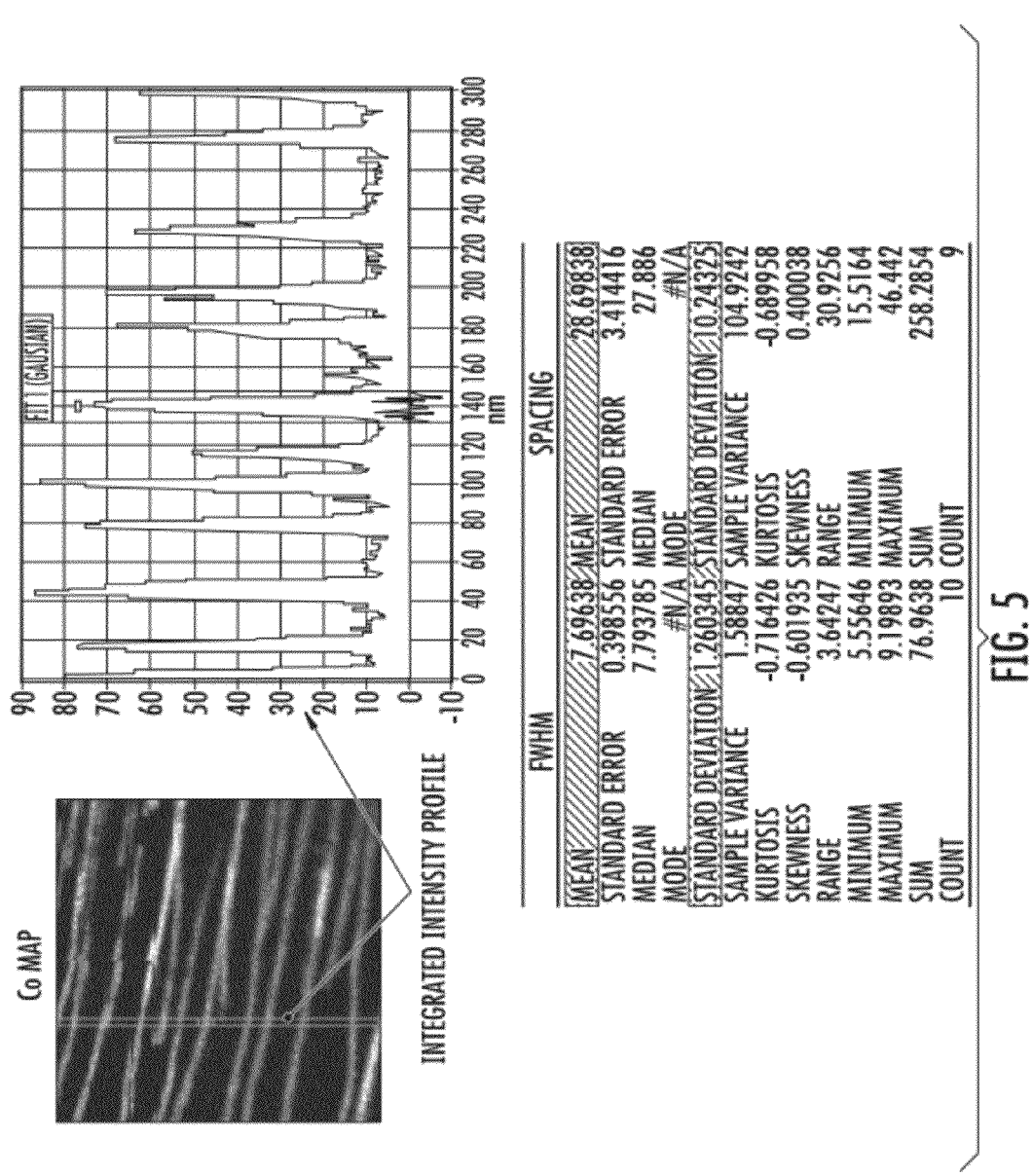
FIG. 5 shows a TEM image of nanowires embedded in a matrix material and a statistical analysis of the diameter of the nanowires and the spacing between adjacent nanowires.

FIG. 5 shows a similar analysis of the nanowires. The analysis shows that the average diameter and spacing for nanowires are ~7.7 nm and 28.7 nm respectively.

The breadth of the nanodots and the diameter of the nanowires have similar values of ~7 nm and ~7.7 nm, which confirms the increased vertical elongation during growth with increasing Co ratio. This observation demonstrates the formation pathway from nanodots nanowires that is suggested by the schematics of FIG. 3(a).

To investigate the chemical composition of the composite films, energy dispersive x-ray spectroscopy (EDS) spectrum images were acquired using a transmission electron microscope operated in scanning mode. The resulting elemental maps of Co, Y/Zr, and O are shown in FIG. 4(a) for the square regions defined in the left images. This analysis confirms that the nanostructures corresponding to nanodots and nanowires are mainly composed of metallic Co and do not contain significant concentrations of Y/Zr or O from the YSZ matrix.

Figure 6:
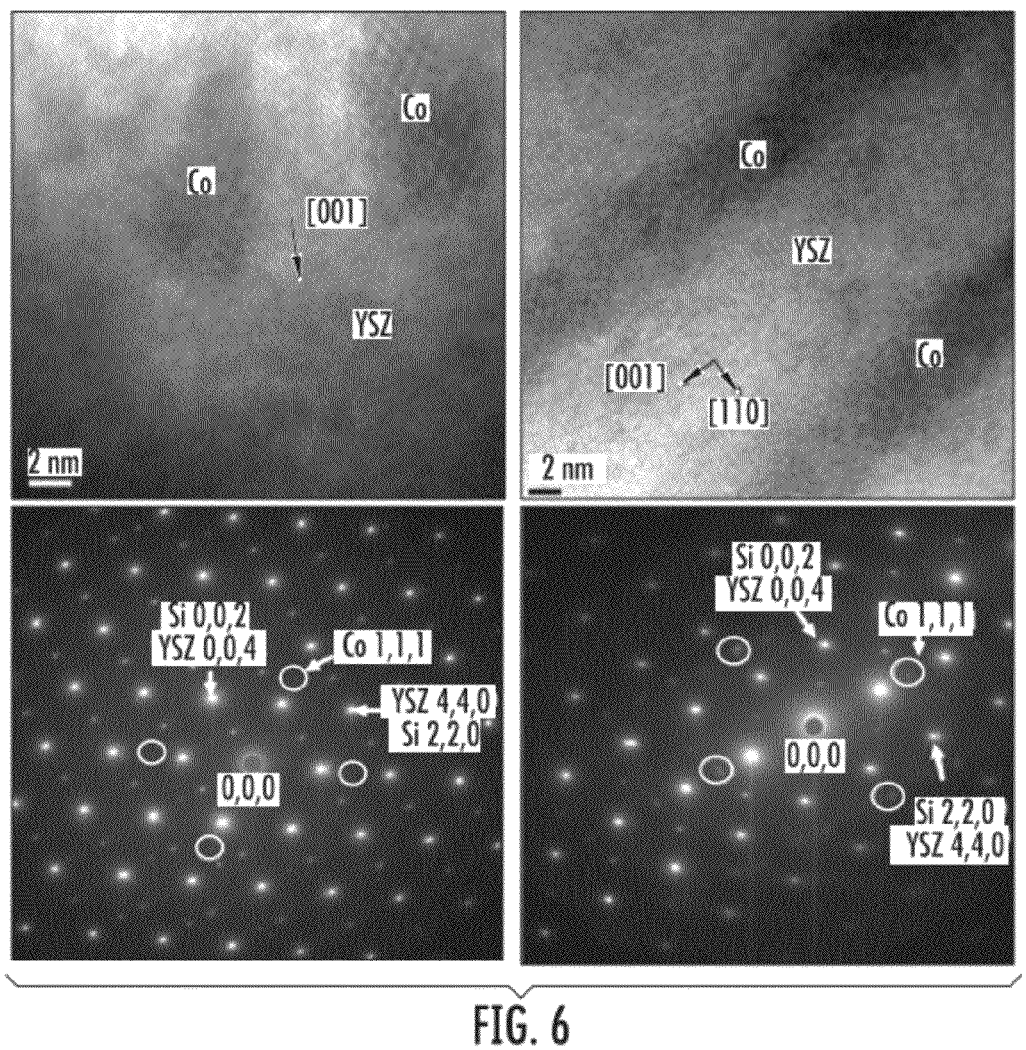
FIG. 6 shows hidh-resolution TEM cross-section images (top) and diffraction patterns (bottom) of Co nanodots (left) and nanowires (right) embedded in a YSZ matrix.

In addition, the high-resolution TEM (HRTEM) cross-section images in FIG. 6 reveal the single crystal nature of the Co nanodots and nanowires embedded in the YSZ matrix. The images and diffraction patterns corresponding to each nanocomposite film in FIG. 6 indicate a heteroepitaxial relationship between the nanodot/nanowire and the matrix.

The crystallographic orientation and epitaxial relationship of the Co nanostructures embedded in YSZ matrix, was further investigated using x-ray diffraction (XRD) $\theta$-$2\theta$ and $\phi$ scans. FIG. 4(b) shows a $\theta$-$2\theta$ scan of the epitaxial YSZ thin film grown on Si (100) before deposition of Co/YSZ nanocomposite films. The $\theta$-$2\theta$ scan of FIG. 4(b) exhibits only Si (n00) and YSZ (n00) peaks without any other extra peak, which is indicative of uniform orientation of deposited YSZ thin films.

FIGS. 4(c) and (d) show that once the phase-separated Co/YSZ nanocomposite layer is deposited, distinct Co peaks are observed corresponding to the high degree of crystallographic orientation in the Co nanostructures. These Co nanostructures have (n00)-oriented epitaxial face-centered cubic (fcc) structures with respect to YSZ matrix and Si substrates. A weak (111) Co peak was detected from nanocomposite layers containing Co nanowires.

Figure 7:
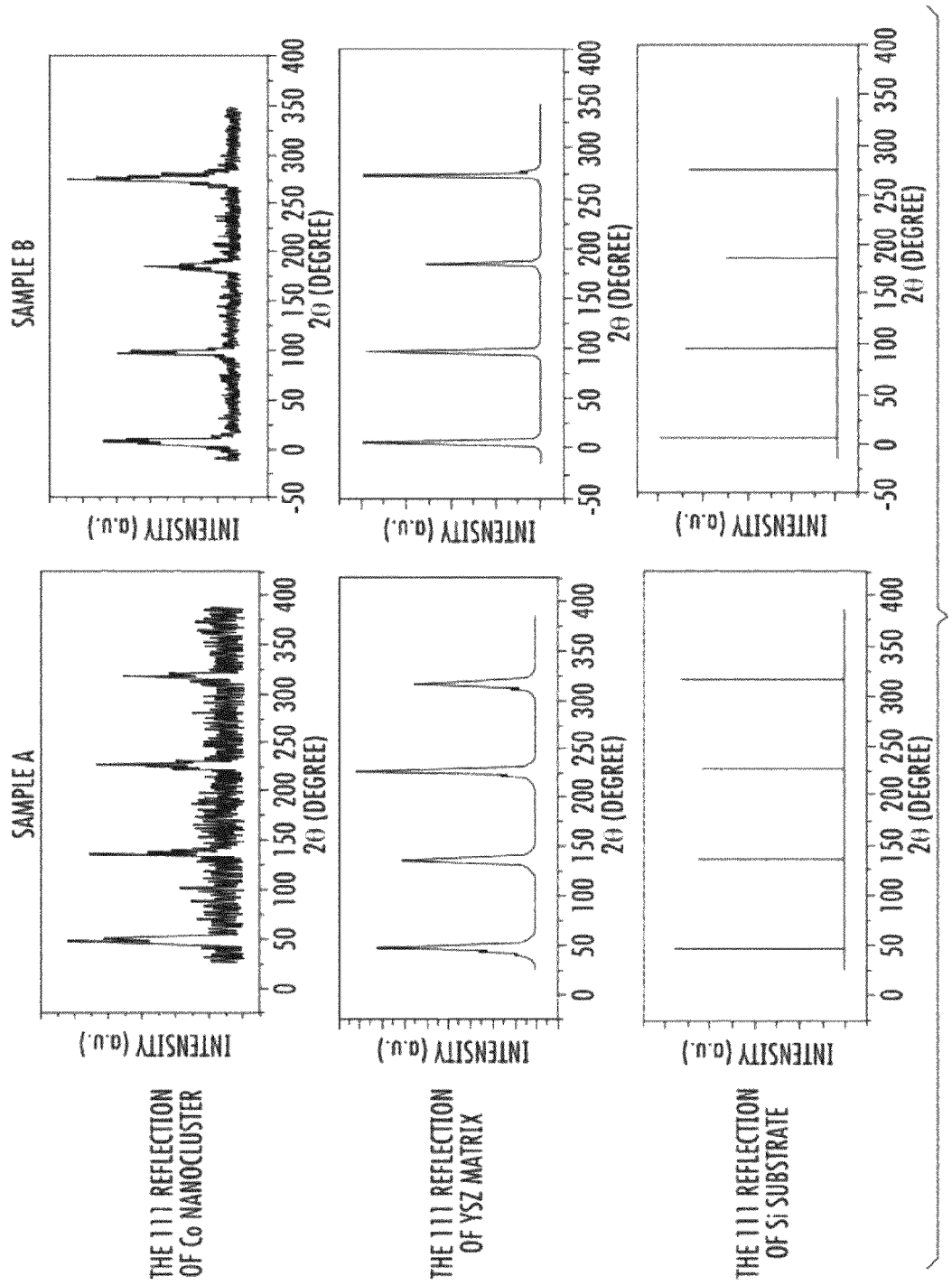
FIG. 7 shows XRD phi-scans for 111 reflections of Co nanostructures, 111 reflections of YSZ matrix and 111 reflections of Si substrate for nanodots (Sample A) and nanowires (Sample B).

FIG. 7 shows XRD phi-scans that confirm the fcc structure of cobalt in nanodots (Sample A) and nanowires (Sample B). The fcc structure is evident from the four-fold symmetry, which indicates cube-on-cube epitaxial growth for Co/YSZ on YSZ buffered Si substrate. The free energy of hexagonal close packed (hcp) bulk cobalt is lower than that of the metastable fcc phase below 700 K. However, the free energy difference between hcp and fcc is small and the structural transition is sluggish, so it is reasonable that no fcc-hcp structural changes happened while the phase-separated nanocomposite films were cooled from the growth temperature (1073 K), particularly considering possible competing contributions from surface energy.

Figure 8A:
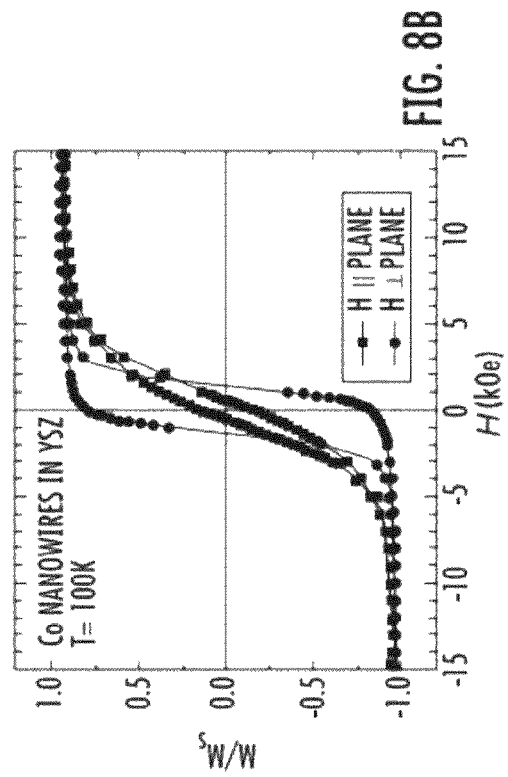
FIG. 8 shows magnetic hysteresis at T=100 K for (a) nanodots and (b) nanowires, and (c) at T=300 K for nanowires with the external magnetic field perpendicular (H⊥plane) and parallel (H∥plane) to the plane. (d) Coercivity as a function of temperature for Co nanodots and nanowires.

Magnetic prosperities of the self-assembled Co nanostructures were measured using a superconducting quantum interference device (SQUID) magnetometer. In-plane and out-of-plane magnetic hysteresis loops of the Co/YSZ nanodots and nanowires at 100 K are shown in FIGS. 8(a) & (b), respectively. The magnetization loops m(H) of Co nanodots in 8(a) are nearly reversible, which reflects weak effects of shape or magnetocrystalline anisotropy, compared with thermal disorder. The coercive Fields $H_c$ are low in this morphology.

Figure 8B:
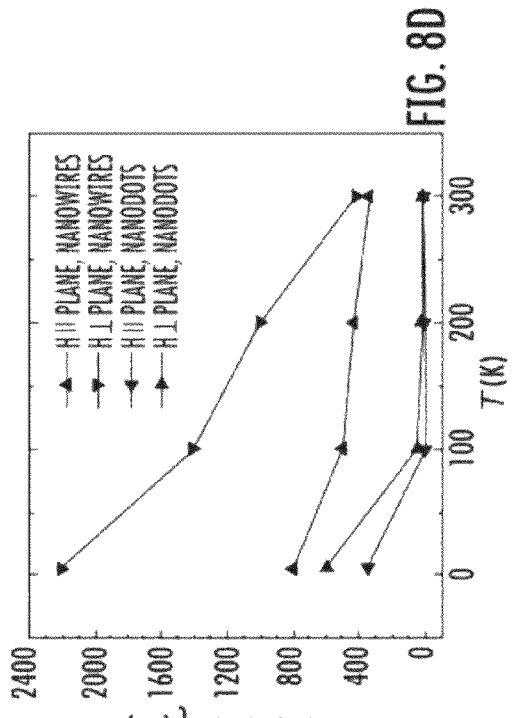

In contrast, FIG. 8(b) shows that the phase-separated material with elongated nanowires of Co exhibit magnetization loops m(H) at 100 K that show significant, orientation-dependent hysteresis. The loop in FIGS. 8(b) relatively "square" and has a higher coercive field when the external field H is applied parallel to the nanowires (perpendicular to the plane), which indicates that the shape anisotropy inhibits reversal of the magnetization. The coercive fields $H_c$ are significantly higher with nanowires than with nanodots.

Figure 8C:
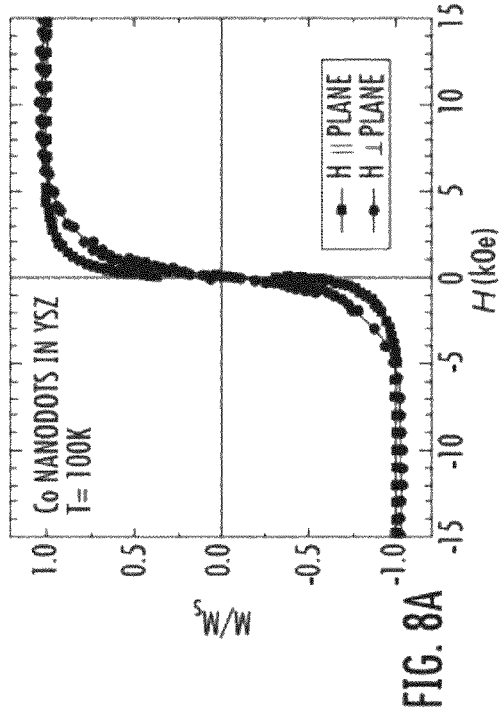

In FIG. 8(c), shows the hysteresis curves of Co nanowires measured at room temperature (RT, 300 K). This data was obtained with the magnetic field applied parallel and perpendicular to the plane. Compared to the low temperature measurement of nanowires in FIG. 8(b), the magnetization loop is still relatively "square" for Co nanowires at 300 K [FIG. 8(c)], with a lower coercive field magnetizing along the easy axis perpendiclar to plane.

As shown in FIG. 8(c), an anisotropy field of ~7000 Oersted (Oe) is obtained from the intersection of both loops along easy (out-of-plane) and hard (in-plane) axes by the magnetization measurements. This value is fairly close to the theoretical anisotropy field of ~6910 Oe for Co. From the measured value of the anisotropy field, the estimated saturation magnetization Ms is ~1110 emu/cm$^3$ using shape anisotropy field $H_A$, for an infinitely thin cylinder $H_A=2\pi Ms$ due to an observed aspect ratio of (l/d)>50. The estimated Ms corresponds to a Co fraction of vol-2%, which is close to the value of 3.5 vol-% Co estimated from the TEM images.

Figure 8D:
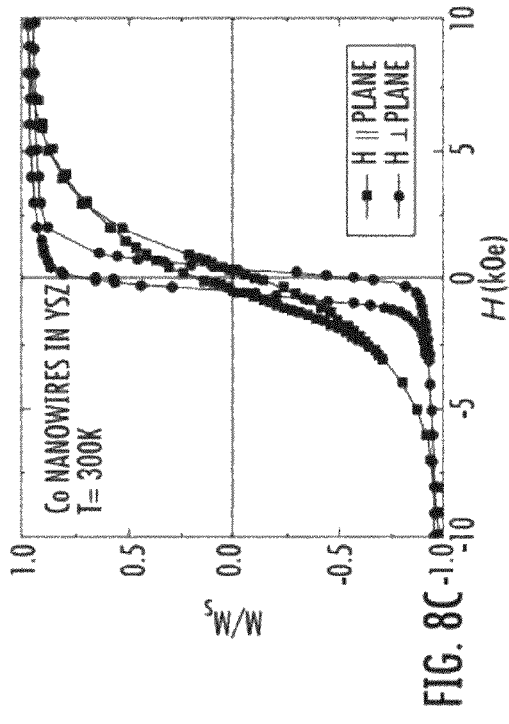

FIG. 8(d) shows the dependence of coercive fields on the temperatures for Co nanodots and nanowires embedded in YSZ matrices. The coercive fields of nanodots and nanowires for any field orientation decrease as temperature increases and the coercive fields of nanowires are relatively higher than those of nanodots. The remarkable coercive field measurements for nanowires were observed at 5 K for field direction perpendicular to the plane. Such coercive fields $H_c$ reflect the size and geometry of the Co nanostructures.

Figure 9B:
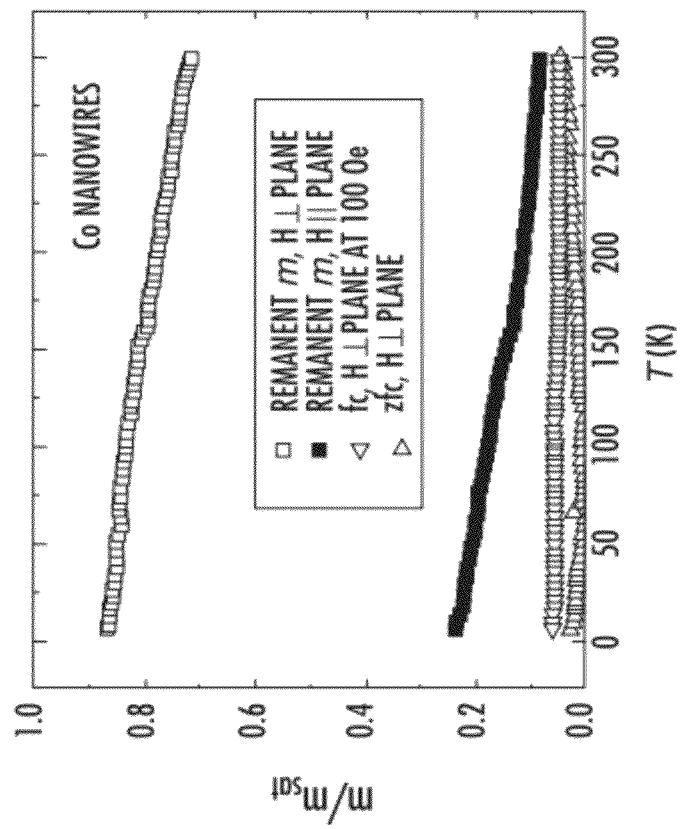
FIG. 9 shows remanence, ZFC and FC magnetization data as a function of temperature for both (a) Co nanodots and (b) Co nanowires.
Figure 9A:
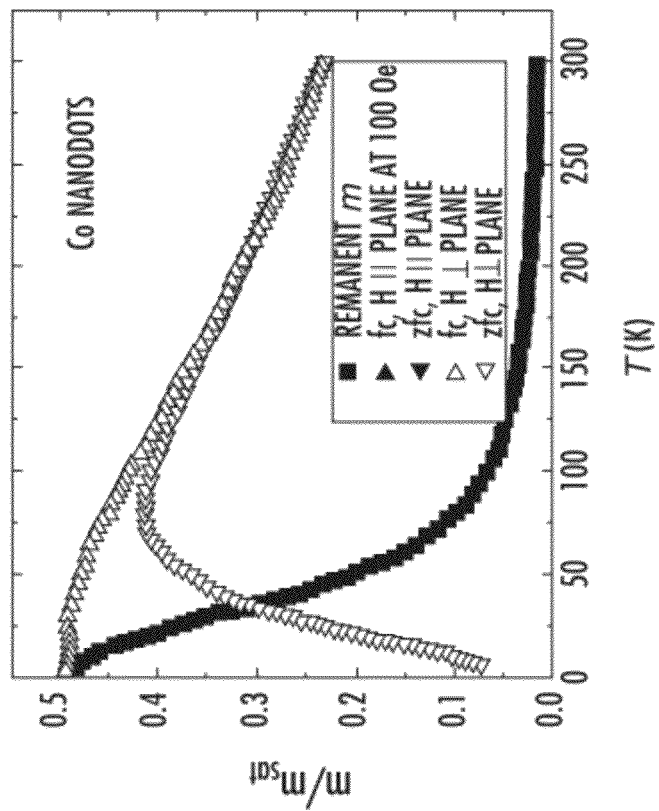

FIG. 9 shows magnetic response as a function of temperature for Co nanodots and nanowires in low or zero applied magnetic fields. In particular, FIG. 9 shows the zero-field-cooled (ZFC) and field-cooled (FC) response in 100 Oe, and out-of-plane and in-plane remanent magnetization versus temperature. FIG. 9(a) demonstrates that the Co nanodots exhibit a superparamagnetic response for $T_B$>~75 K, where $T_B$ is the blocking temperature. Above $T_B$, magnetization becomes unstable in orientation due to thermal disorder, and the remanent magnetization is quite low.

The blocking temperature ($T_B$) can be estimated for Co nanodots using the relation $T_B=\Delta E/25k_B$ where $\Delta E$ and $k_B$ are the associated energy barrier and the Boltzmann constant, respectively. In this example, $T_B$ is estimated as ~40 K for a small cylinder with a diameter of 7 nm and a length of 12 nm. The associated energy barrier per unit volume of particles can be expressed with magnetocrystalline anisotropy parameters of fcc phase Co, which were taken from the experimental data. The experimentally observed $T_B$ of 75 K is fairly close to the estimated $T_B$ of 40 K, with the 35 K difference within the error in the estimation of volume of nanodots for calculation of estimated $T_B$. Interestingly, the ZFC and FC curves of fcc Co nanodots in FIG. 9(a) are almost identical regardless of whether the magnetic field H is directed parallel to or perpendicular to the plane. This reflects the cubic symmetry of the aligned small particles and their roughly equiaxed shape.

In contrast, the magnetic response in Co nanowires depends strongly on the orientation of the external field H. As shown in FIG. 9(b), the remanence magnetization is large when the field is applied along the easy axis parallel to the nanowires, and much smaller when applied orthogonal to nanowires, which are aligned along the c-axis. At 300 K, the out-of-plane remanent magnetization for Co nanowires remains large. This demonstrates usefulness of these materials for ultra-high density magnetic data storage devices. With the pronounced shape anisotropy of the elongated nanowires of Co, the zfc-fc response in a 100 Oe field was very weak and no blocking temperature is observed [FIG. 9(b)].

The combined studies on self-assembled, epitaxial Co nanostructures embedded in YSZ matrix using TEM, XRD, and SQUID indicate that the morphology of these low dimensional nanostructures can be controllably synthesized to higher dimensions dependent on the growth conditions such as the ablation ratio of Co to YSZ. The epitaxial cube-on-cube relationship between Co nanostructure and YSZ matrix was apparent from the TEM and XRD measurements for both nanodots and nanorods. The Co nanodots exhibited magnetocrystalline isotropy in magnetic response, whereas Co nanowires exhibited c-axis alignment along the normal to the film plane and large shape anisotropy in magnetic response. Based on this data, it is estimated that Co nanowires spaced 29 nm apart embedded in an insulating YSZ matrix will exhibit an ultrahigh magnetic recording density of at least 0.8 Tb/in$^2$. In addition, similar results should be possible by controlling the morphology of nanoparticles embedded in an insulating YSZ matrix.

We claim:
1. A nanocomposite article, comprising:
   a. a single-crystal substrate having a surface; and
   b. a heteroepitaxial, phase-separated layer supported by the surface, said heteroepitaxial layer comprising:
      i. from 1-99 vol % of a continuous, non-magnetic, crystalline, matrix phase, and
      ii. from 1-99 vol % of an ordered magnetic phase disposed within said matrix phase, said ordered phase comprising a plurality of self-assembled crystalline nanostructures of a magnetic material, wherein the number density of self-assembled crystalline nanostructures is from 400 to 4×104 per µm².

2. The nanocomposite article according to claim 1, wherein a recording or data storage density of said nanocomposite article is at least 0.75 Tb/in².

3. The nanocomposite article according to claim 1, further comprising a buffer layer disposed between said substrate and said phase-separated layer.

4. The nanocomposite article according to claim 3, wherein said matrix phase and said buffer layer have the same composition.

5. The nanocomposite article according to claim 1, wherein said single-crystal substrate is silicon.

6. The nanocomposite article according to claim 1, wherein said continuous, non-magnetic, crystalline, matrix phase comprises a material selected from the group consisting of oxides, nitrides, carbides, borides, and combination thereof.

7. The nanocomposite article according to claim 1, wherein said continuous, non-magnetic, crystalline matrix phase comprises yttria-stabilized zirconia.

8. The nanocomposite article according to claim 1, wherein said ordered magnetic phase comprises a ferromagnetic metal.

9. The nanocomposite article according to claim 1, wherein said ordered magnetic phase comprises a ferromagnetic compound.

10. The nanocomposite article according to claim 1, wherein said ordered magnetic phase comprises Co.

11. An electronic storage device, comprising:
a nanocomposite article according to claim 1; and
a read-write head for reading and/or writing information to a heteroepitaxial, phase-separated layer of said nanocomposite article.

12. The electronic storage device according to claim 11, wherein said read-write head is for at least one of longitudinal reading/writing and perpendicular reading/writing.

13. A method of forming a nanocomposite, comprising:
providing a single-crystal substrate having a surface; and
depositing a heteroepitaxial, phase-separated layer over the surface, said phase-separated layer comprising:
  i. from 1-99 vol % of a continuous, non-magnetic, crystalline, matrix phase, and
  ii. from 1-99 vol % of an ordered, magnetic phase disposed within said matrix phase, said ordered magnetic phase comprising a plurality of self-assembled crystalline nanostructures of a magnetic material,
wherein the number density of self-assembled crystalline nanostructures is from 400 to 4×10⁴ per µm².

14. The method according to claim 13, wherein a recording density of the nanocomposite is at least 0.75 Tb/in².

15. The method according to claim 14, wherein said depositing step comprises simultaneous deposition of said continuous, non-magnetic, crystalline, matrix phase, and said ordered magnetic phase via an epitaxial formation technique.

16. The method according to claim 15, wherein said depositing step comprises a deposition process selected from the group consisting of pulsed laser ablation, chemical vapor deposition (CVD), metallorganic chemical vapor deposition (MOCVD), sputtering and e-beam co-evaporation.

17. The method according to claim 13, wherein a target for said epitaxial formation technique comprises a non-magnetic material and a magnetic material.

18. The method according to claim 13, further comprising depositing a buffer layer over the substrate prior to depositing the heteroepitaxial layer.

19. The method according to claim 13, wherein said continuous, non-magnetic, crystalline, matrix phase comprises a material selected from the group consisting of oxides, nitrides, carbides, borides, and combination thereof.

20. The method according to claim 13, wherein said continuous, non-magnetic, crystalline matrix phase comprises yttria-stabilized zirconia.

21. The method according to claim 13, wherein said ordered magnetic phase comprises a ferromagnetic metal.

22. The method according to claim 13, wherein said ordered magnetic phase comprises a ferromagnetic compound.

23. The method according to claim 13, wherein said ordered magnetic phase comprises Co.

24. A nanocomposite article, comprising:
a. a single-crystal-like substrate having a surface; and
b. a heteroepitaxial, phase-separated layer supported by the surface, said heteroepitaxial layer comprising:
  i. from 1-99 vol % of a continuous, non-magnetic, crystalline, matrix phase, and
  ii. from 1-99 vol % of an ordered magnetic phase disposed within said matrix phase, said ordered phase comprising a plurality of self-assembled crystalline nanostructures of a magnetic material,
wherein the single-crystal-like substrate is selected from the group consisting of rock-salt and a Wurtzite crystal structure, wherein the number density of self-assembled crystalline nanostructures is from 400 to 4×10⁴ per µm².

25. A method of forming a nanocomposite, comprising:
providing a single-crystal-like substrate having a surface; and
depositing a heteroepitaxial, phase-separated layer over the surface, said phase-separated layer comprising:
  i. from 1-99 vol % of a continuous, non-magnetic, crystalline, matrix phase, and
  ii. from 1-99 vol % of an ordered, magnetic phase disposed within said matrix phase, said ordered magnetic phase comprising a plurality of self-assembled crystalline nanostructures of a magnetic material,
wherein the single-crystal-like substrate is selected from the group consisting of rock-salt and a Wurtzite crystal structure,
wherein the number density of self-assembled crystalline nanostructures is from 400 to 4×10⁴ per µm².

* * * * *